(12) United States Patent
Cao

(10) Patent No.: US 11,765,989 B2
(45) Date of Patent: Sep. 19, 2023

(54) ELECTRICAL-CURRENT CONTROL OF STRUCTURAL AND PHYSICAL PROPERTIES VIA STRONG SPIN-ORBIT INTERACTIONS IN CANTED ANTIFERROMAGNETIC MOTT INSULATORS

(71) Applicant: The Regents of the University of Colorado, Denver, CO (US)

(72) Inventor: Gang Cao, Broomfield, CO (US)

(73) Assignee: The Regents of the University of Colorado, Denver, CO (US)

( * ) Notice: Subject to any disclaimer, the term of this patent is extended or adjusted under 35 U.S.C. 154(b) by 904 days.

(21) Appl. No.: 16/600,011

(22) Filed: Oct. 11, 2019

(65) Prior Publication Data

US 2020/0119274 A1    Apr. 16, 2020

Related U.S. Application Data

(60) Provisional application No. 62/744,708, filed on Oct. 12, 2018.

(51) Int. Cl.
| | | |
|---|---|---|
| G11C 13/00 | (2006.01) | |
| H10N 80/10 | (2023.01) | |
| H03K 17/84 | (2006.01) | |
| H01F 41/32 | (2006.01) | |
| H01F 10/32 | (2006.01) | |
| H10N 80/00 | (2023.01) | |

(52) U.S. Cl.
CPC ......... *H10N 80/10* (2023.02); *G11C 13/0007* (2013.01); *H01F 10/3218* (2013.01); *H01F 41/32* (2013.01); *H03K 17/84* (2013.01); *H10N 80/01* (2023.02); *G11C 2213/15* (2013.01); *G11C 2213/31* (2013.01); *G11C 2213/32* (2013.01)

(58) Field of Classification Search
CPC .................................................. G11C 13/0007
USPC ...................................................... 423/593.1
See application file for complete search history.

(56) References Cited

U.S. PATENT DOCUMENTS

2017/0174526 A1\* 6/2017 Banerjee ................ C01G 31/02

OTHER PUBLICATIONS

Cao, G. et al., "Electrical Control Of Structural And Physical Properties Via Strong Spin-Orbit Interactions In Sr2IrO4," Physical Review Letters, vol. 120, pp. 017201-1-017201-6, Jan. 4, 2018.
Pergament, A. et al., "Electrical Switching In Thin Film Structures Based On Transition Metal Oxides," Advances in Condensed Matter Physics, vol. 2015, Article ID 654840,26 pages, 2015.

\* cited by examiner

*Primary Examiner* — Tomi Skibinski

(57) ABSTRACT

A composition of matter consisting primarily of a stabilizing element and a transition metal oxide, wherein the transition metal oxide is an anti-ferromagnetic Mott insulator with strong spin orbit interactions, and the composition of matter has a canted crystal structure.

16 Claims, 34 Drawing Sheets
(34 of 34 Drawing Sheet(s) Filed in Color)

US 11,765,989 B2

ELECTRICAL-CURRENT CONTROL OF STRUCTURAL AND PHYSICAL PROPERTIES VIA STRONG SPIN-ORBIT INTERACTIONS IN CANTED ANTIFERROMAGNETIC MOTT INSULATORS

RELATED APPLICATIONS

This application hereby claims the benefit of and priority to U.S. Provisional Patent Application No. 62/744,708, titled "ELECTRICAL-CURRENT CONTROL OF STRUCTURAL AND PHYSICAL PROPERTIES VIA STRONG SPIN-ORBIT INTERACTIONS IN CANTED ANTIFERROMAGNETIC MOTT INSULATORS", filed on Oct. 12, 2018 and which is hereby incorporated by reference in its entirety.

STATEMENT REGARDING FEDERALLY SPONSORED RESEARCH

This invention was made with government support under grant numbers DMR1712101 and DMR1903888 awarded by the National Science Foundation. The government has certain rights in the invention.

BACKGROUND

Electrical control of structural and physical properties is a long-sought, but elusive goal of contemporary science and technology. Unfortunately, the use of current to control material properties has been difficult to obtain. Instead, traditional approaches have needed to rely on the use of magnetic fields and electric fields to control certain material properties.

Also, charge-based memory devices are approaching physical limits on their size, as smaller devices are capable of holding less charge. As there is some minimum level of charge necessary for memory, there is a corresponding limit to the minimum size of these memory devices.

OVERVIEW

Various embodiments of the present technology generally relate to materials that change structural properties and/or physical properties in response to receiving an applied electrical current. In addition, some embodiments include various systems and methods for controlling materials with electrical current to control structural, physical, and electrical properties, such as size, magnetization, resistivity, and the like. Various embodiments utilize materials with strong spin-orbit interactions (SOI) (also called spin orbital coupling) and a canted antiferromagnetic (AFM) Mott state. The canted AFM insulator with strong SOI (e.g., $Sr_2IrO_4$, $BaIrO_3$, or $Ca_2RuO_4$) can provide a strong locking of canted Ir magnetic moments to $IrO_6$-octahedra, causing them to rigidly rotate together. A coupling between an applied electrical current and the canting angle reduces the Néel temperature and drives a large, non-linear lattice expansion that closely tracks the magnetization, increases the electron mobility, and precipitates a unique resistive switching effect.

For example, in some embodiments, a composition of matter can consist primarily of a stabilizing element (e.g., Sr, Ba, or Ca) and a transition metal oxide. In some embodiments, the transition metal oxides can include various 5d transition metal oxides or 4d transition metal oxides. The transition metal oxide can be an anti-ferromagnetic Mott insulator with strong spin orbit interactions, and the composition of matter can have a canted crystal structure.

In other embodiments, various methods for electrical-current control of structural and physical properties of a material are provided. The methods can include applying current along a first dimension of the material. In some embodiments, the material can consist primarily of a stabilizing element and a transition metal oxide. The transition metal oxide can be an anti-ferromagnetic Mott insulator with strong spin orbit interactions. In some embodiments, the composition of matter can have a canted crystal structure. Applying current along a first dimension of the material can result in a change in size and resistivity of the material along a second dimension.

These materials and techniques for electrically controlling the structural and physical properties can have a lot of different applications. For example, these materials and techniques may be used for creating resistive random-access memory, variable resistive materials, and many uses for materials that change in size in response to electrical current.

In accordance with various embodiments, these materials may be created as single crystal materials using a floating zone furnace or flux technology to melt the raw material, then cooled into a single crystal using methods similar to those commonly used to create silicon wafers for the electronics industry.

This Overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figures 1A, 1B, 1C:
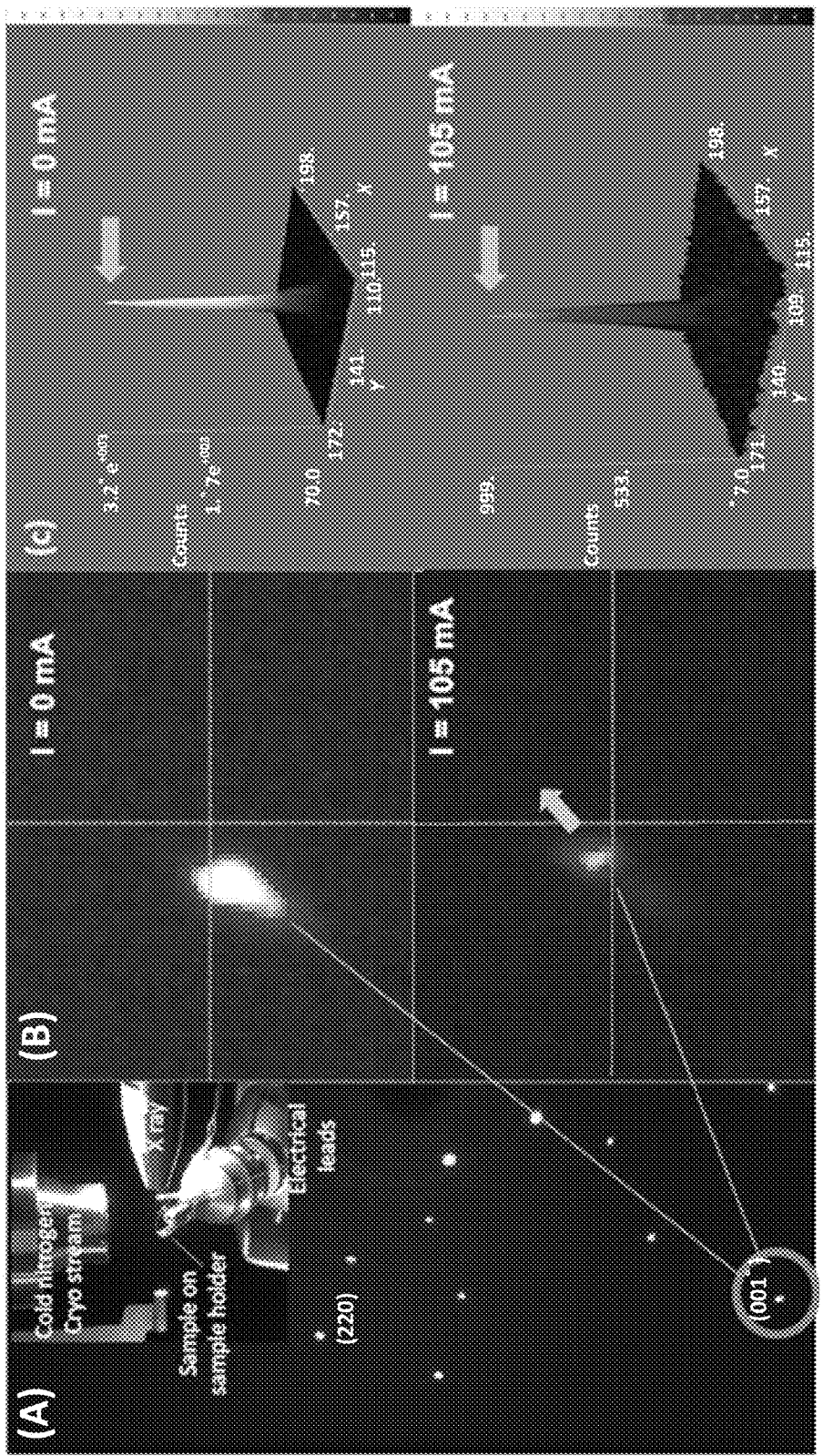
FIGS. 1A-1C illustrate an exemplary single-crystal x-ray diffraction of $Sr_2IrO_4$ with current applied within the basal plane of the crystal.

The following description and associated drawings teach the best mode of the invention. For the purpose of leaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Electrical control of structural and physical properties is a long-sought, but elusive goal of contemporary science and technology. Various embodiments of the present technology demonstrate that an otherwise unremarkable combination of strong spin-orbit interactions (SOI) and a canted antiferromagnetic (AFM) Mott state is sufficient to attain that goal. The AFM insulator $Sr_2IrO_4$ provides a model system in which strong SOI lock canted Ir magnetic moments to $IrO_6$-octahedra, causing them to rigidly rotate together. A novel coupling between an applied electrical current and the canting angle reduces the Néel temperature and drives a large, non-linear lattice expansion that closely tracks the magnetization, increases the electron mobility, and precipitates a unique resistive switching effect. Various embodiments of the present technology open new avenues for understanding fundamental physics driven by strong SOI in condensed matter, and provide a new paradigm for functional materials and devices.

A unique competition between spin-orbit interactions (SOI) and Coulomb correlations, U, in 4d- and 5d-elements and their compounds drives unusual physical behaviors that markedly differ from those of their 3d counterparts. The 5d-based iridates display particularly strong and surprising influences of SOI on their physical properties. Early studies indicated iridates exhibit a preference for magnetic, insulating ground states, a trend now recognized as a consequence of a combined effect of U and strong SOI. An important example of this effect is the $J_{eff}=\frac{1}{2}$ Mott state identified in $Sr_2IrO_4$, whose defining characteristic is the strong locking of the lattice and Ir magnetic moments.

Various embodiments of the present technology provide a new study of $Sr_2IrO_4$ that centers on unconventional, single-crystal x-ray diffraction measurements with simultaneous application of electrical current to diffracted samples as well as the I-V characteristics, electrical resistivity and magnetization as functions of temperature, electrical current and magnetic field. Various embodiments of the present technology show that application of electrical current causes the a-axis lattice parameter to expand by 1% that, in turn, precipitates profound changes in physical properties. The current-controlled lattice expansion closely tracks the long-range magnetic order, causing a considerable decrease in both the Néel temperature ($T_N$) and magnetization, due to the strong SOI that rigidly locks the Ir moments to the lattice. The current-dependence of the a-axis expansion is highly non-linear, which induces the novel I-V characteristics of $Sr_2IrO_4$.

Simultaneous control of structural and physical properties via electrical current is a rare, but extremely desirable goal of contemporary condensed matter research because of its great technological potential. The various embodiments of the present technology that show such behavior in $Sr_2IrO_4$ open new avenues for understanding the fundamental consequences of strong SOI in crystalline solids, and provide a new paradigm for development of functional materials and devices.

$Sr_2IrO_4$ is the archetype, SOI-driven insulator with $T_N=240$ K, and an electronic energy gap $\Delta \leq 0.62$ eV. It crystallizes in a tetragonal structure with space-group $I4_1/acd$ (No. 142) with $a=b=5.4846$ Å and $c=25.804$ Å at 13K. Recent studies suggest a further reduced space group $I4_1/a$ (No. 88) for $Sr_2IrO_4$. Two signature characteristics of $Sr_2IrO_4$ are essential for understanding the results of this study: (1) Rotation of the $IrO_6$-octahedra about the c-axis by approximately 12°, which corresponds to a distorted in-plane Ir1-O2-Ir1 bond angle θ, has a critical effect on the ground state. (2) The magnetic structure is composed of ordered moments (0.208(3) $\mu_B$/Ir) canted within the basal plane. The 13° canting of the moments away from the a-axis closely tracks the staggered rotation of the $IrO_6$ octahedra, which sharply contrasts the behavior of 3d oxides.

FIGS. 1A-1C illustrate exemplary single-crystal x-ray diffraction of $Sr_2IrO_4$ with current I applied within the basal plane of the crystal. FIG. 1A illustrates a representative x-ray diffraction pattern of a single crystal. The circled Bragg peak is (0,0,16). Inset: Sample mounting showing electrical leads and cryogenic gas feed. Current-controlled changes in (FIG. 1B) the location and (FIG. 1C) the intensity (counts) of (0016) peak for I=0 and I=105 mA.

A representative diffraction pattern taken with the basal plane of $Sr_2IrO_4$ nearly perpendicular to the incident x-ray beam is shown in FIG. 1A. The Bragg peaks for Miller indices (220) or (0016) are representative for the discussion that follows. The position and intensity of the (0016) peak for temperature T=200 K are shown in FIG. 1B and FIG. 1C, respectively, and undergo remarkable changes upon the application of basal-plane electrical currents I up to 105 mA. The (0016) peak shifts up and to the right with a threefold reduction in intensity that is sensitive to the atomic positions within a unit cell (FIG. 1C). Other Bragg peaks exhibit similar shifts with current, and either enhanced or reduced intensities, which reflects changing interference generated by shifts in atom positions. The lattice changes due to current are also accompanied by a subtle but visible color and size change of the sample, as seen under a polarizing microscope.

The current-controlled changes in the a- and c-axis were quantitatively characterized by x-ray diffraction for current applied either to the basal plane or along the c-axis. The lattice responds more strongly to current in the basal plane than along the c-axis, which suggests that the orientation of the Ir moments is important, and that Joule heating is not affecting the data.

FIGS. 2A-2D illustrate: (FIG. 2A) Current-controlled shifts Δa/a and Δc/c for $Sr_2IrO_4$. Note that Δa/a closely tracks $M_a$ (right scale); (FIG. 2B) for comparison to FIG. 2A: Δa/a and Δc/c for $Sr_2Ir_{0.97}Tb_{0.03}O_4$, note that the scales for Δa/a, Δc/c and $M_a$ are the same as those in FIG. 2A to facilitate comparisons; (FIG. 2C) thermal expansion of $Sr_2IrO_4$: temperature dependence of a- and c-axis for I=0; and (FIG. 2D) temperature-induced shifts δa/a and δc/c corresponding to FIG. 2C.

Figures 2A, 2B:
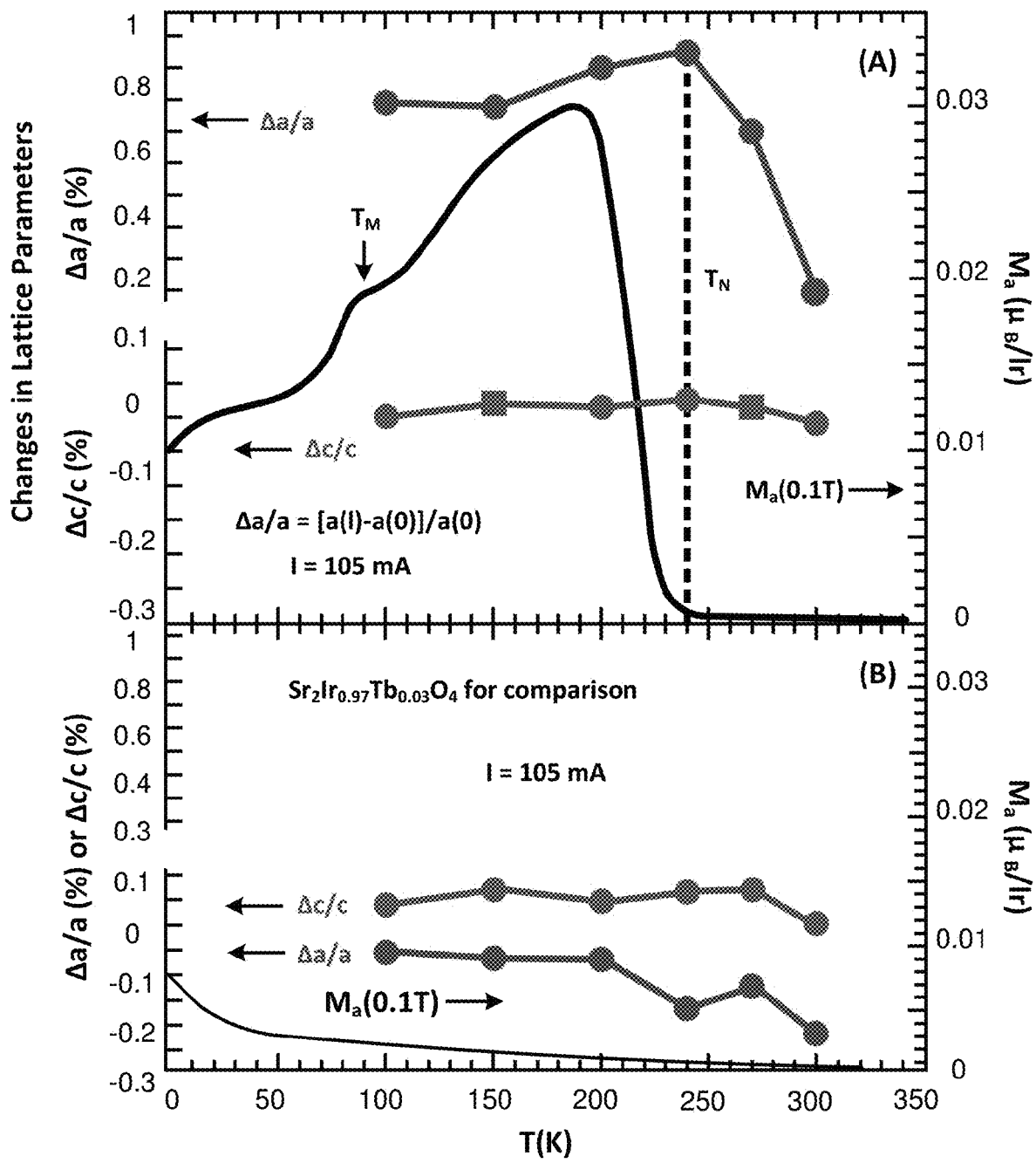
FIG. 2A illustrates exemplary current-controlled shifts $\Delta a/a$ and $\Delta c/c$ for $Sr_2IrO_4$.
FIG. 2B illustrates exemplary current-controlled shifts $\Delta a/a$ and $\Delta c/c$ for $Sr_2Ir_{0.97}Tb_{0.03}O_4$.

Focusing on normalized changes in the a- and c-axis lattice parameters Δa/a and Δc/c with basal-plane I, where Δa/a=[a(I)−a(0)]/a(0), and 0 mA≤I≤105 mA; Δc/c is similarly defined. FIG. 2A shows Δa/a peaks at nearly 1% near $T_N$, then decreases to 0.2% at 300 K, whereas Δc/c<0.1%. The clear difference between Δa/a and Δc/c once again does not support a Joule heating effect, and further confirms an important role for the in-plane Ir moments. A more striking observation is that the temperature dependence of Δa/a closely tracks that of the a-axis magnetization, $M_a$, (FIG. 2A). This is direct evidence that the current-controlled expansion of the a-axis involves interlocking of cooperative magnetic order and the lattice. In accordance with some embodiments, the reduced magnetic canting must be accompanied by a simultaneous, increased θ, which is critical in determining the ground state.

The current-controlled a-axis expansion is strongly associated with long-range AFM order. A parallel study of $Sr_2Ir_{0.97}Tb_{0.03}O_4$ shows that a 3% replacement of $Ir^{4+}$ by $Tb^{4+}$ leads to a disappearance of $T_N$, but conveniently retains the insulating state and the original crystal structure. The absolute values of Δa/a and Δc/c for $Sr_2Ir_{0.97}Tb_{0.03}O_4$ for I=105 mA are small (<0.2%) and weakly temperature-dependent in the absence of AFM order (FIG. 2B). A comparison of FIGS. 2A and 2B clearly points to an essential role played by long-range AFM in the current-controlled lattice expansion, and further eliminates a Joule heating effect.

Figures 2C, 2D:
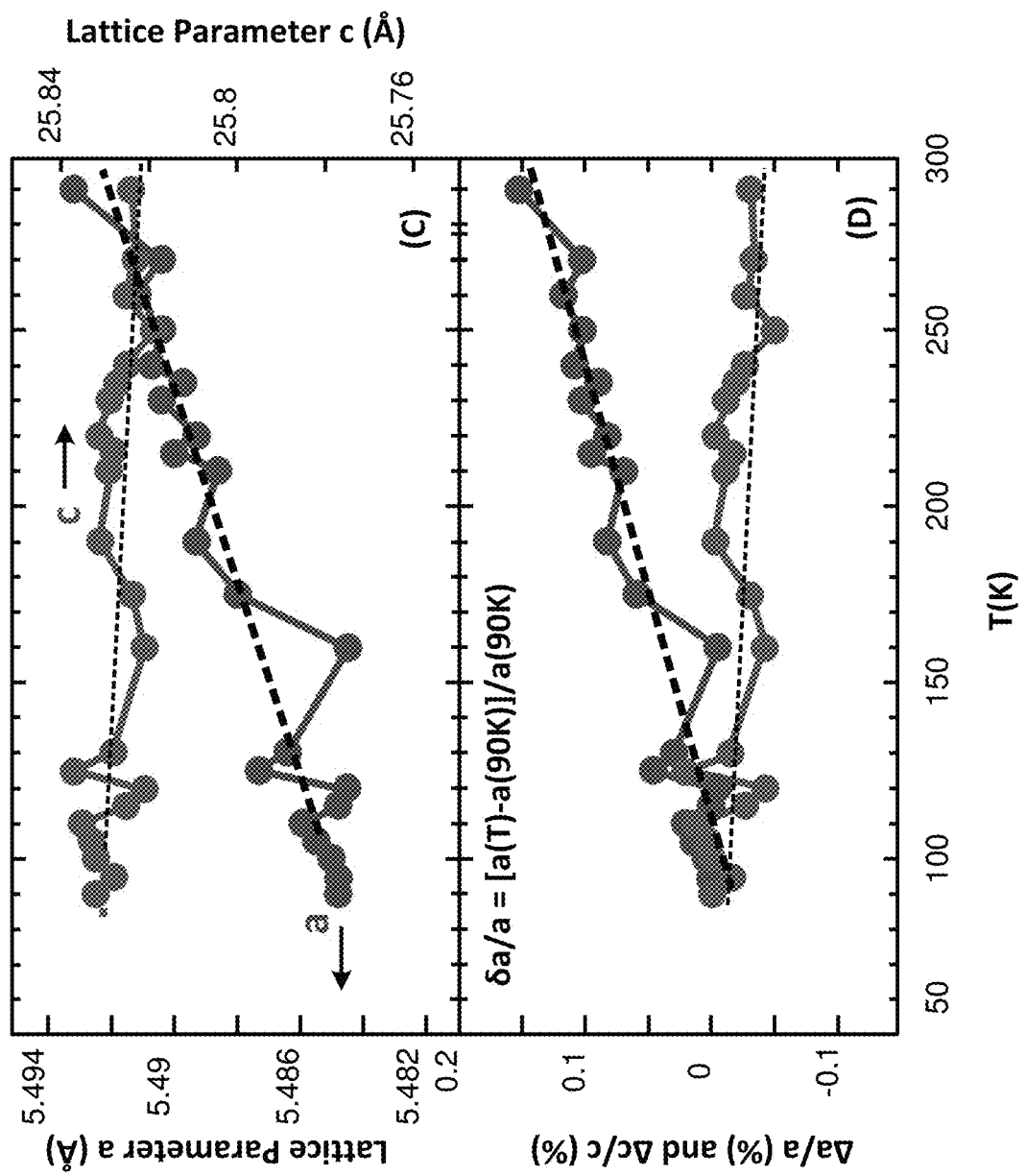
FIG. 2C illustrates exemplary thermal expansion of $Sr_2IrO_4$: Temperature dependence of a- and c-axis for I=0.
FIG. 2D illustrates exemplary temperature-induced shifts $\delta a/a$ and $\delta c/c$ corresponding to FIG. 2C.

The conventional thermal expansion of $Sr_2IrO_4$ was also measured without application of current. The temperature dependence of the a- and c-axis and their corresponding changes δa/a and δc/c due to pure thermal expansion (δa/a=[a(T)−a(90K)]/a(90K) and δc/c is similarly defined) shows that the a-axis expands linearly and only slightly (~0.1%) from 90 K to 300 K (FIGS. 2C and 2D). The corresponding coefficient of linear thermal expansion α≡1/a (da/dT) is approximately $5.0 \times 10^{-6}$ $K^{-1}$, which is small and comparable to those of many materials. The small thermal expansion of $Sr_2IrO_4$ is also consistent with its high melting point (>1900° C.), which reflects bond energies on the order of electron volts. The sharp contrast between the conventional thermal expansion Sala (0.1%) and the novel current-controlled Δa/a (~1%) highlights the extraordinary coupling between current and the AFM state.

FIGS. 3A-3D illustrate: the temperature dependence of (FIG. 3A) a-axis magnetic susceptibility $\chi_a$(T) at a few representative currents; (FIG. 3B) $d\chi_a$(T)/dT clarifying the decrease in $T_N$ with I; (FIG. 3C) $M_a$(H) at 100 K for a few representative currents; and (FIG. 3D) current dependence of $T_N$ and $M_a$. Diagrams illustrate the current-controlled lattice expansion, θ and Ir moments (black arrows) with current.

Figures 3A, 3B:
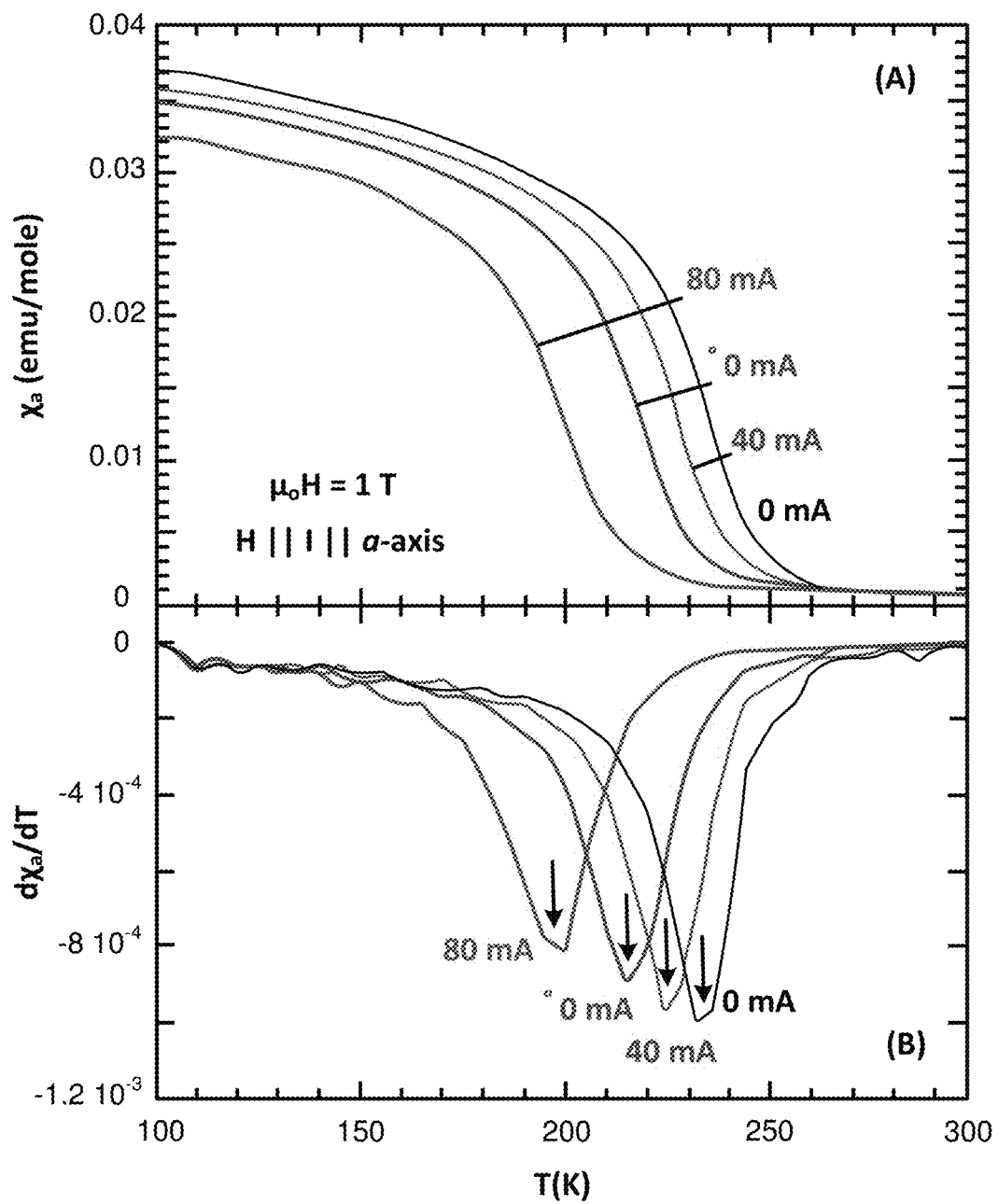
FIG. 3A illustrates exemplary temperature dependence of a-axis magnetic susceptibility $\chi_a(T)$ at a few representative currents.
FIG. 3B illustrates exemplary temperature dependence of $d\chi_a(T)/dT$ clarifying the decrease in $T_N$ with I.
Figure 3C:
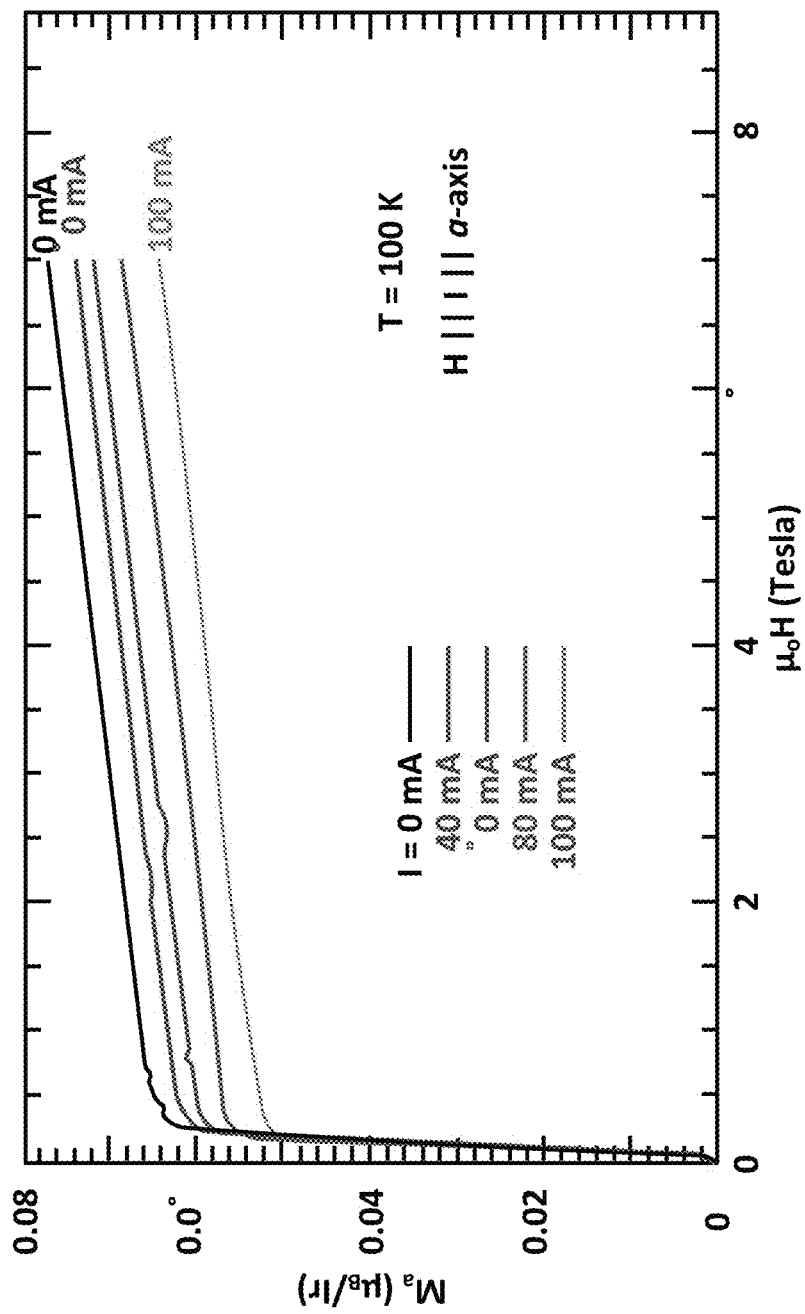
FIG. 3C illustrates exemplary $M_a(H)$ at 100 K for a few representative currents.
Figure 3D:
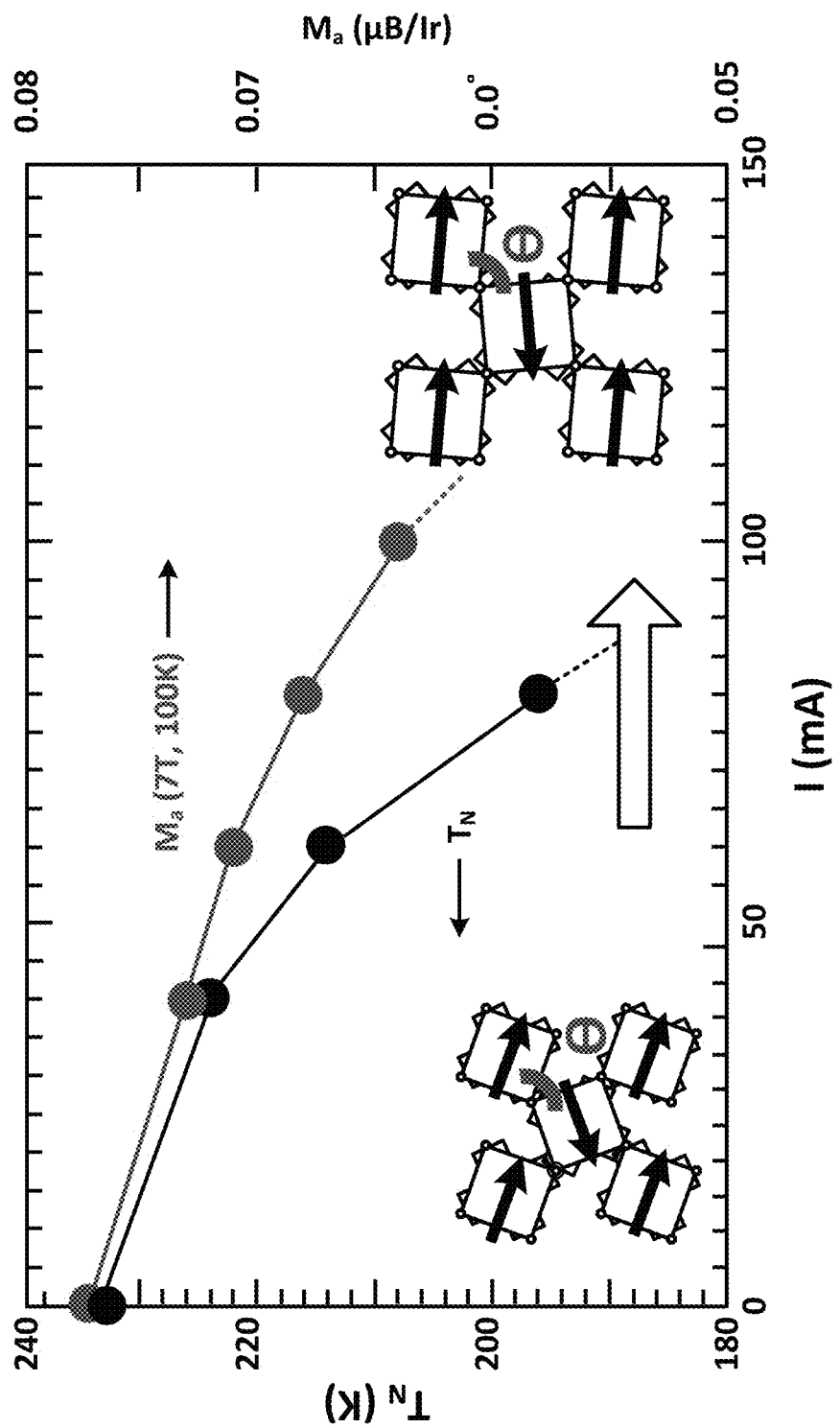
FIG. 3D illustrates exemplary current dependence of $T_N$ and $M_a$.

Significant changes in the a-axis magnetic susceptibility $\chi_a$(T) and the a-axis magnetization $M_a$ are seen when current is applied (FIG. 3). $T_N$ is drastically decreased by 40 K for I=80 mA (FIGS. 3A and 3B) and the value of $M_a$ is reduced by 16% (FIGS. 3C and 3D). Magnetic canting is ascribed to a Dzyaloshinsky-Moriya interaction that is closely associated with θ; the canting decreases with increasing θ and vanishes when θ=180°. This is consistent with the reduced $M_a$ that signals enhanced itinerancy due to the increased θ.

Another prominent consequence of the current-controlled lattice expansion is non-Ohmic behavior that features a negative differential resistance (NDR). NDR is a nonlinear phenomenon with a ratio of voltage to current ΔV/ΔI<0, contrary to Ohm's law, which describes a linear relationship between voltage and current, thereby a positive resistance or ΔV/ΔI>0. The phenomenon is in general attributed to either an "electrothermal" effect or a "transferred carrier" effect. The more common form of NDR is manifest in "N"-shaped I-V characteristics. Alternatively, an "S"-shaped NDR has been observed in various memory devices and a few hulk materials such as $VO_2$, $CuIr_2S_{4-x}Se_x$, $Ca_3Ru_2O_7$ and $1T-TaS_2$. These bulk materials are characterized by a first-order metal-insulator transition (MIT) and, except for $Ca_3Ru_2O_7$, are without an AFM state. The "S"-shaped NDR in these materials is closely associated with the first-order MIT, and attributed to drastic differences in crystal and electronic structures below and above MIT.

Figure 4A:
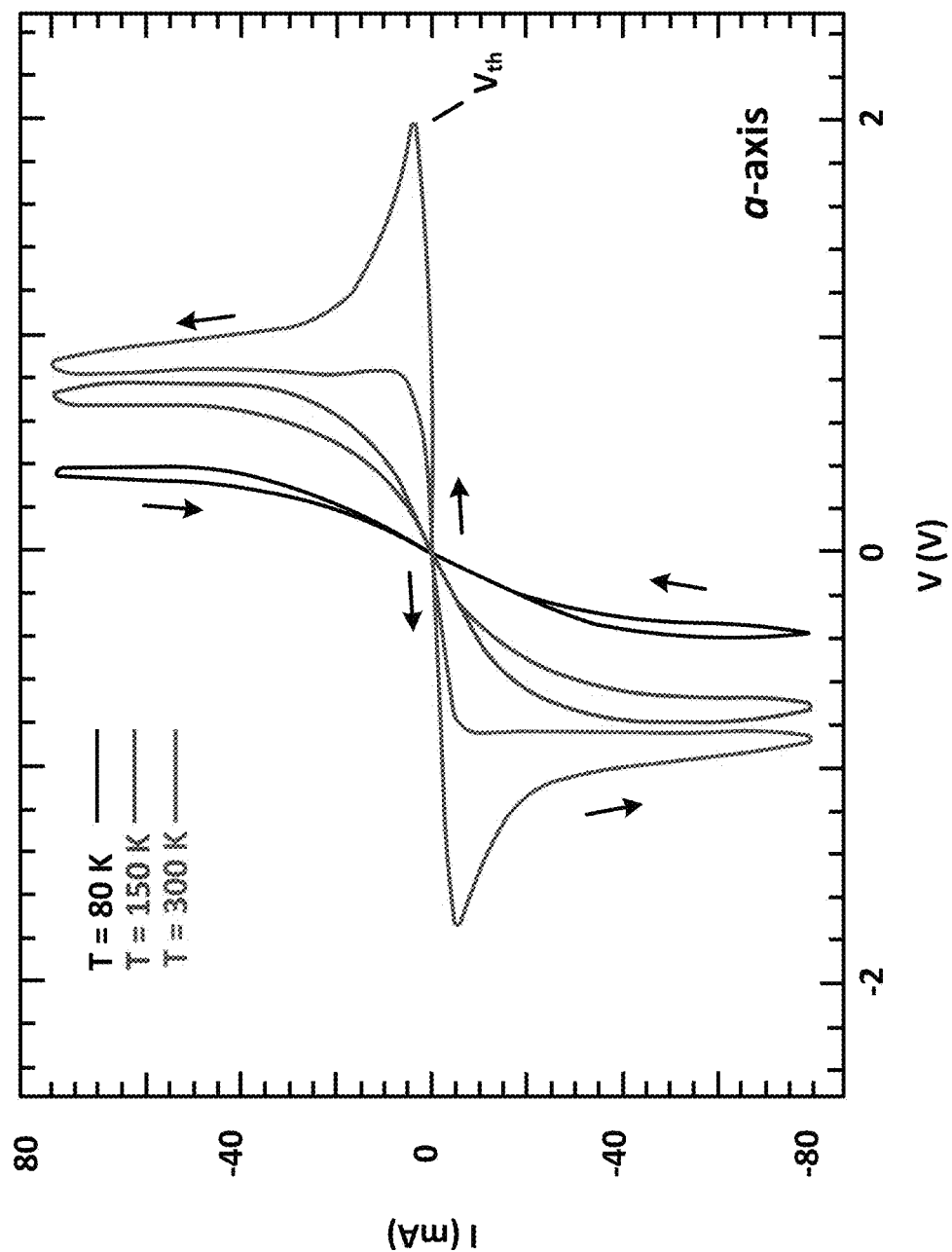
FIG. 4A illustrates exemplary I-V curves for $Sr_2IrO_4$ for current applied along the a-axis.
Figure 4B:
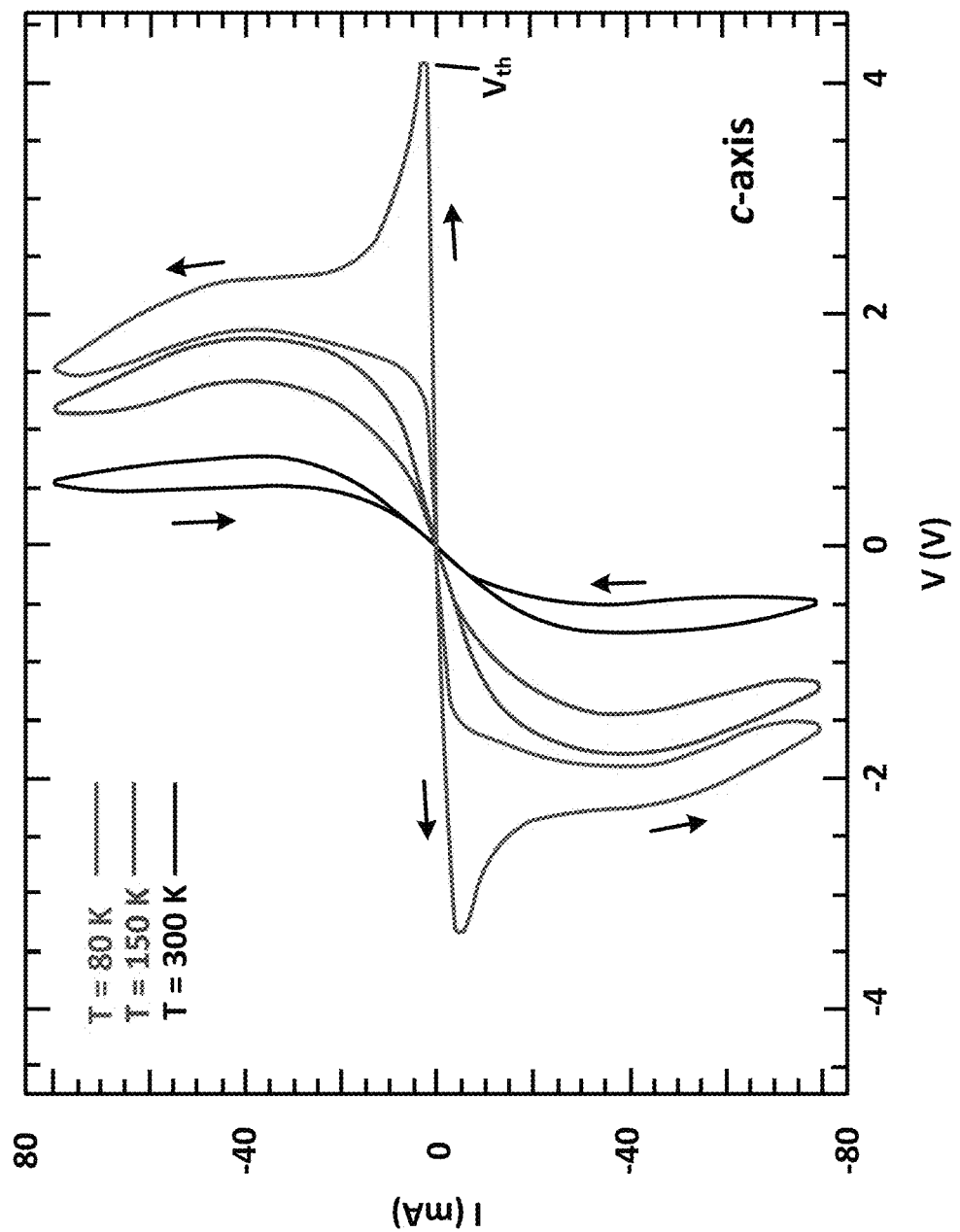
FIG. 4B illustrates exemplary I-V curves for $Sr_2IrO_4$ for current applied along the c-axis.
Figure 4C:
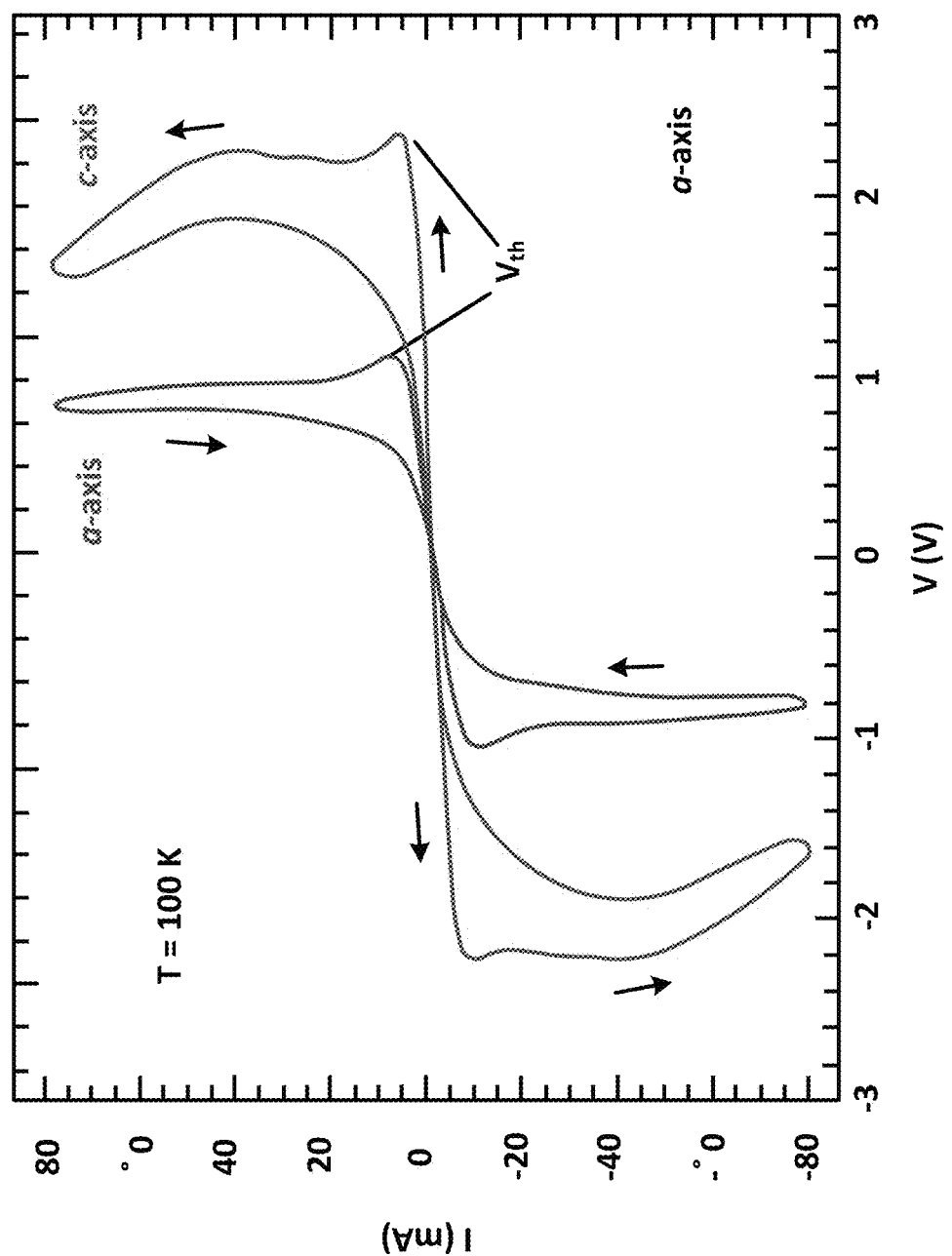
FIG. 4C illustrates exemplary I-V curves for $Sr_2IrO_4$ for current applied along both the a-axis and the c-axis.

FIGS. 4A-4C illustrate I-V curves for $Sr_2IrO_4$ for: (FIG. 4A) current applied along the a-axis, (FIG. 4B) along the c-axis, and (FIG. 4C) both the a- and c-axis at T=100 K. Arrows show the evolution of the current sweeps in FIGS. 4A-4C.

Figure 4D:
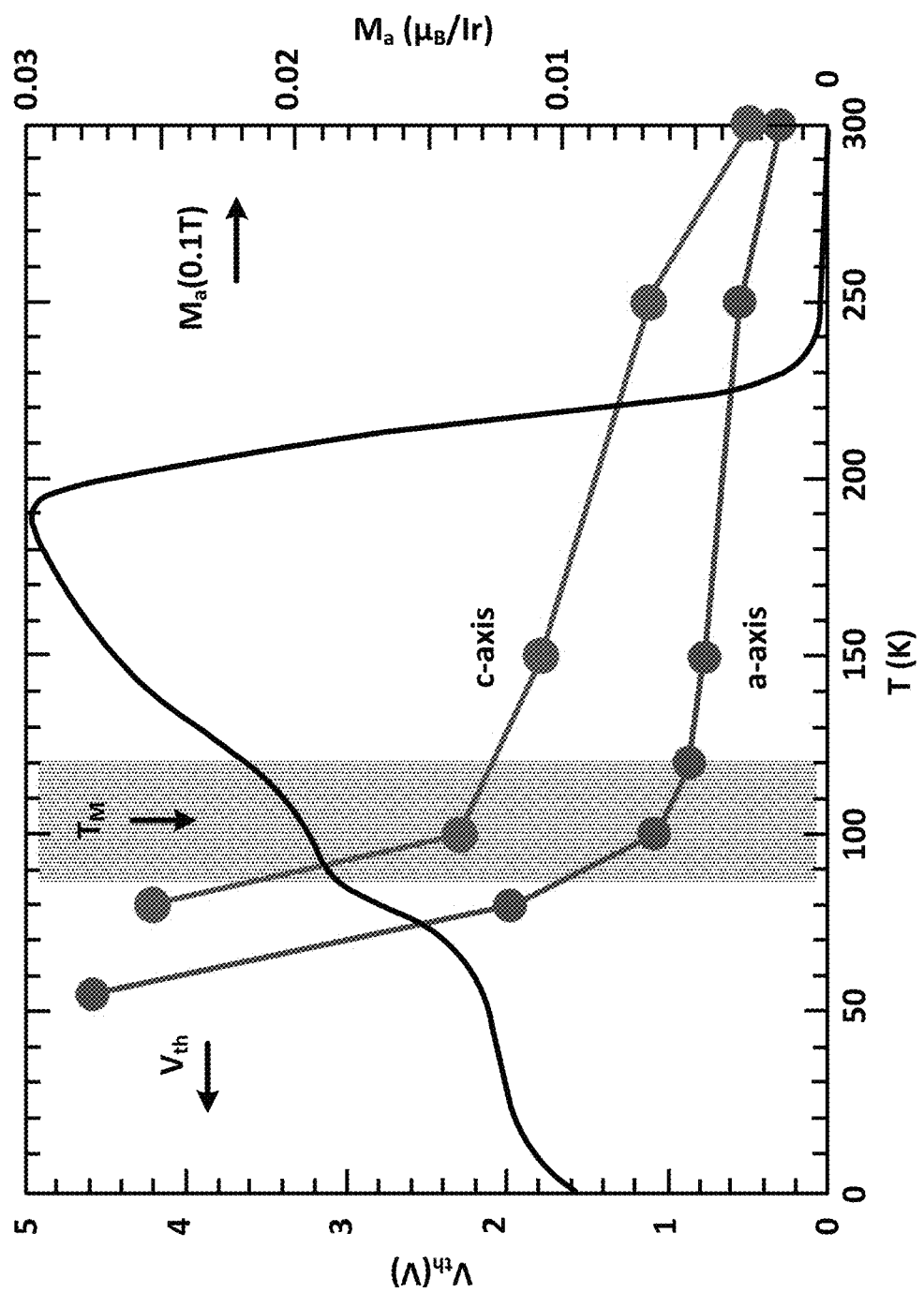
FIG. 4D illustrates exemplary temperature dependence of the threshold voltage $V_{th}$ and $M_a(T)$.
Figure 4E:
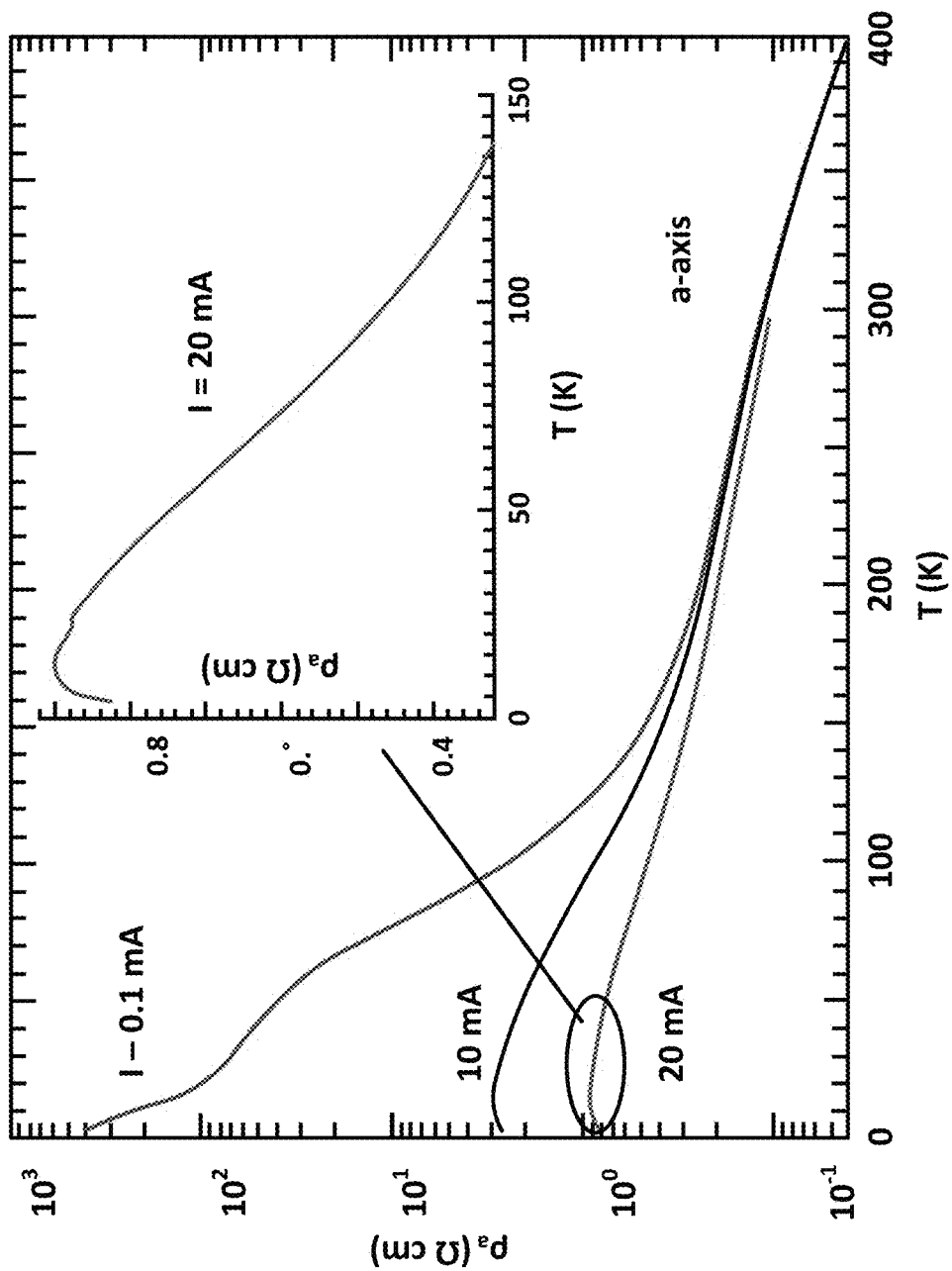
FIG. 4E illustrates exemplary temperature dependence of the a-axis resistivity $\rho_a$.
Figure 4F:
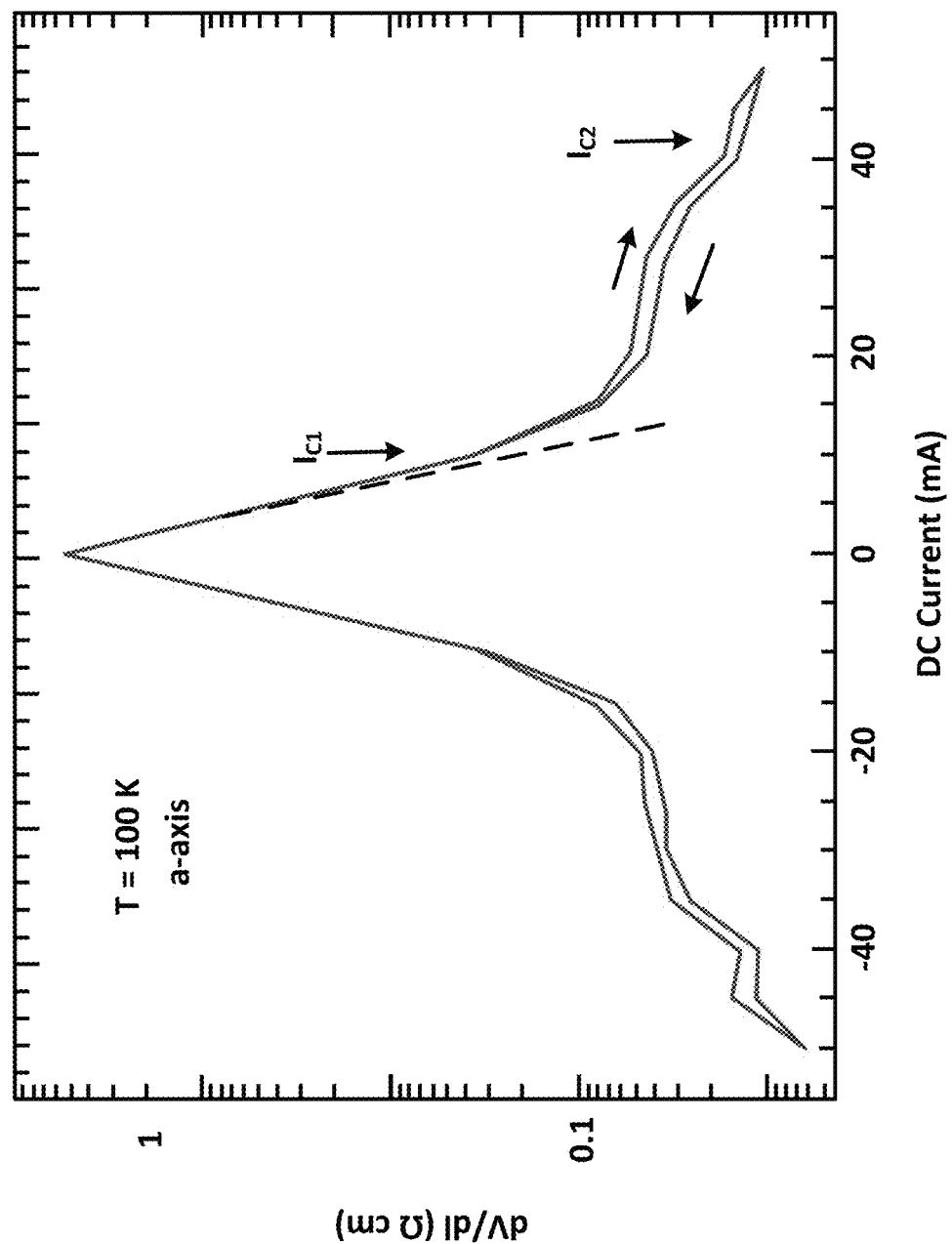
FIG. 4F illustrates exemplary representative data for $dV/dI$ as a function of DC current at $T=100$ K.

FIGS. 4D and 4E illustrate the temperature dependence of: (FIG. 4D) the threshold voltage $V_{th}$ and $M_a$(T) (right scale), and (FIG. 4E) the a-axis resistivity $\rho_a$. Inset: Expanded $\rho_a$ for I=20 mA. FIG. 4F illustrates representative data for dV/dI as a function of DC current at T=100 K. Note two slope changes marked at I=$I_{C1}$ and $I_{C2}$. Arrows show the sequence of applied current, and the dashed line is a guide to the eye.

Contrasting the above materials, $Sr_2IrO_4$ features a prominent AFM order and a Mott insulating state that persists up to at least 600 K without a MIT, indicating a different mechanism that drives the NDR. The "S"-shaped NDR was observed in an earlier study of $Sr_2IrO_4$ but the underlying mechanism remained unclear up to now. The I-V curves for current applied along either the a- or c-axis at a few temperatures are presented in FIGS. 4A and 4B, along with the strong anisotropy of the response in FIG. 4C. A linear I-V response during an initial current ramp is followed by a sharp threshold voltage $V_{th}$ that marks a switching point where voltage abruptly drops with increasing current, thus signaling an NDR. Another broad turning point emerges with further current increase, and is more distinct in the c-axis I-V curves for T<100 K.

A plot of $V_{th}$ as a function of temperature displays a pronounced slope change near 100 K, where an anomaly in $M_a$ occurs (FIG. 4D). Previous studies have shown that $M_a$ undergoes two additional anomalies at $T_M \approx$ 100 K and 25 K (FIG. 4D), due to moment reorientations, which is corroborated by a muon-spin rotation and relaxation study. Note that the increased scatter in the a- and c-axis values between 100 K and 150 K in FIGS. 2C and 2D are most likely due to the reorientation of the Ir moments, and are at the root of the unusual magnetoresistivity and magnetoelectric behavior. That this magnetic reorientation separates the different regimes of I-V behavior below and above $T_M \approx$ 100 K suggests a close relation between the magnetic state and the I-V characteristics (FIG. 4D).

The NDR behavior exhibited by $Sr_2IrO_4$ reflects a novel mechanism that fundamentally differs from that operating in other materials. This is based on constructing a picture that self-consistently explains the complex NDR behavior, and the current-controlled expansion and magnetization data. Note that the a-axis resistivity $\rho_a$ that drops by nearly three orders of magnitude at low temperatures (FIG. 4E) and the corresponding activation energy gap estimated from 100-270 K decreases from 81 meV to 32 meV as current increases from 0.1 mA to 20 mA. There is a clear drop of $\rho_a$ with decreasing temperature after peaking around 11 K (FIG. 4E Inset), indicating an incipient metallic state. The representative differential resistance, dV/dI, at 100 K reveals two anomalies near 10 mA and 45 mA, marked as $I_{C1}$ and $I_{C2}$, respectively (FIG. 4F).

Figures 5A, 5B:
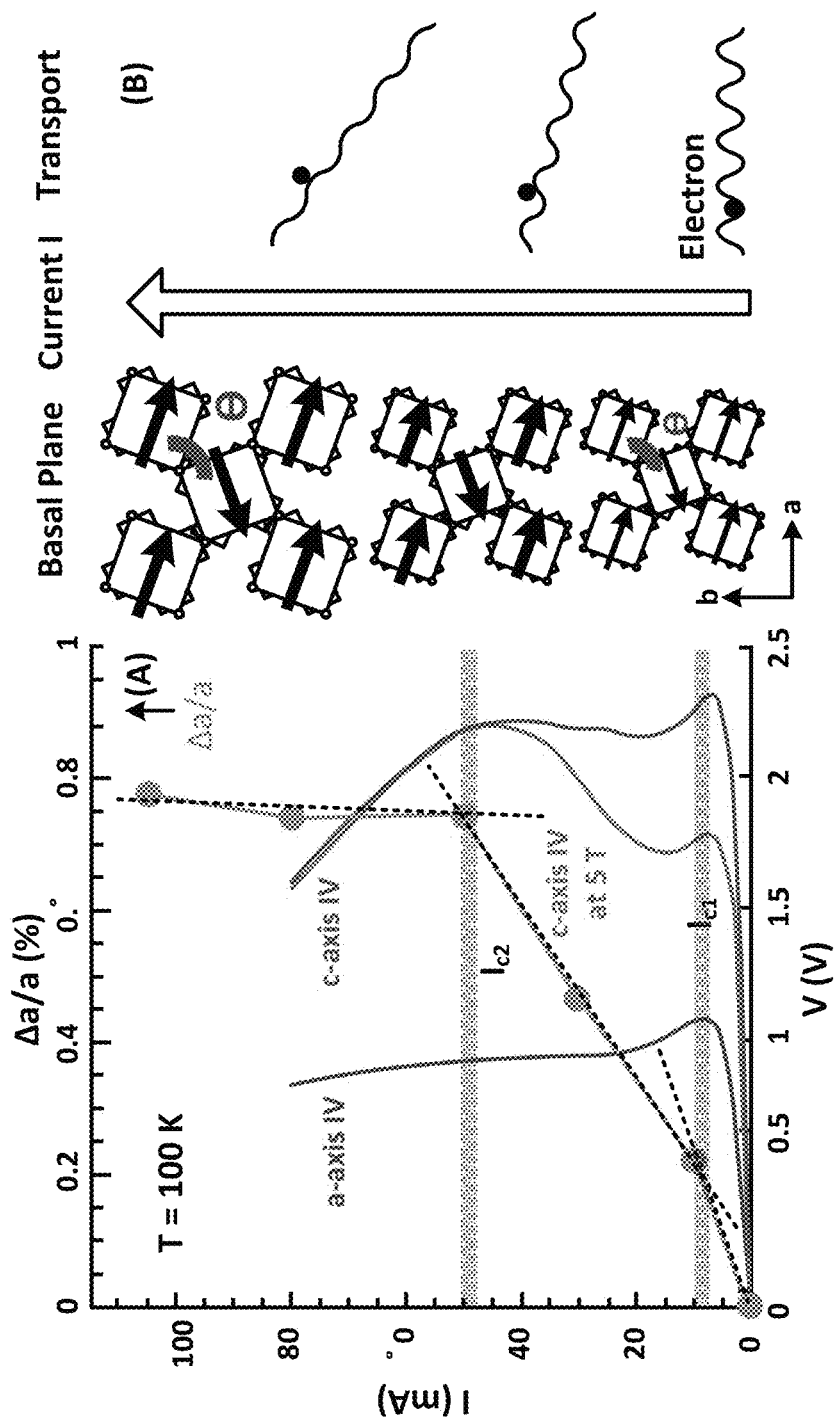
FIG. 5A illustrates exemplary I-V curves for the a- and c-axis at $T=100$ K and $\mu_o H=0$ and 5 T along the c-axis, along with $\Delta a/a$ at $T=100$ K.
FIG. 5B illustrates the increasing lattice expansion, decreasing θ (red) and moment canting (black arrows) with increasing I.

FIG. 5A illustrates I-V curves for a- and c-axis at T=100 K and $\mu_o H$=0 and 5 T along the c-axis; along with $\Delta a/a$ at T=100 K (upper horizontal axis). Dashed lines are guides to the eye. Note that slope changes of $\Delta a/a$ occur at the two turning points at $I_{C1}$ and $I_{C2}$, respectively. FIG. 5B (not to scale) illustrates the increasing lattice expansion, decreasing θ and moment canting (black arrows) with increasing current. Schematic increase of electron mobility due to decreased gapping of the electronic structure with current is illustrated.

Corresponding I-V curves at 100 K feature a sharp switching point ($V_{th}$) at $I_{C1}$ and a broader turning point near $I_{C2}$ (FIG. 5A). Note that the current-controlled a-axis expansion $\Delta a/a$ closely tracks the I-V curves with non-linear changes at $I_{C1}$ and $I_{C2}$, respectively (upper horizontal axis in FIG. 5A). The slope changes in $\Delta a/a$ signal successively more rapid expansions of the a-axis at $I_{C1}$ and $I_{C2}$, each accompanied by a more significant increase in θ, which, in turn, enhances electron hopping (FIG. 5B). As the current further increases above $I_{C2}$=45 mA, $\Delta a/a$ appears to saturate. This explains why a magnetic field (H) reduces voltage considerably only between $I_{C1}$ and $I_{C2}$, but shows no visible effect above $I_{C2}$ (see green curve in FIG. 5A) because the magnetic field can only increase θ via realigning the Ir moments below $I_{C2}$: Above $I_{C2}$, the saturation of $\Delta a/a$ corresponds to θ approaching 180°, which precludes further increases, and magnetic field can therefore no longer affect the I-V curves. The close association between $\Delta a/a$, moment canting and the I-V curves reveals how current-controlled basal-plane expansion drives the nonlinear I-V characteristics.

Fundamentally, the formation of the Mott insulating state with canted $IrO_6$-octahedra and canted moments is caused by a cooperative transition in which the electronic structure gaps, thereby lowering its energy relative to the paramagnetic metallic state. The gapping mechanism involves electronic correlations that involve both spin-orbit coupling and scattering through the magnetic reciprocal lattice vector. The electronic correlation is expected to manifest itself in the unoccupied states (electron-carrier) and in the occupied (hole-carrier) states. The momentum shift associated with a finite current is usually negligible in uncorrelated systems but, in correlated systems close to quantum critical points, theory shows that relatively small changes in the low-energy electronic structure can cause large (non-linear) changes in the ordered structure. In short, a slight modification of the electronic structure induced by current may result in strong modifications of the electronic correlations. The NDR data is interpreted in terms of a reduction in the gapping, as suggested in FIG. 4E, and the concomitant decrease in the carriers' effective masses induced by current.

A combination of strong SOI and canted AFM order can lead to a highly desirable paradigm for simultaneous electrical control of the crystal structure and physical properties of $Sr_2IrO_4$: (1) Strong SOI lock canted Jr moments to the $IrO_6$-octahedra, which rigidly rotate together (FIG. 2). (2) Strong SOI dictate the low-energy Hamiltonian and creates small gaps in the electronic structure, which ultimately affect electron mobility (i.e., an increase in θ favors electron hopping; see FIGS. 4 and 5). (3) Applied current effectively drives a lattice expansion by increasing θ and reducing small gaps in the electronic structure (FIG. 4E), which also reduces $T_N$ and the Jr moments (FIG. 3). Similar behavior may be widespread and present in other iridates. This technology offers a new paradigm for studies of the physics driven by the SOI and may help unlock a world of possibilities for functional materials and devices.

Figure 6:
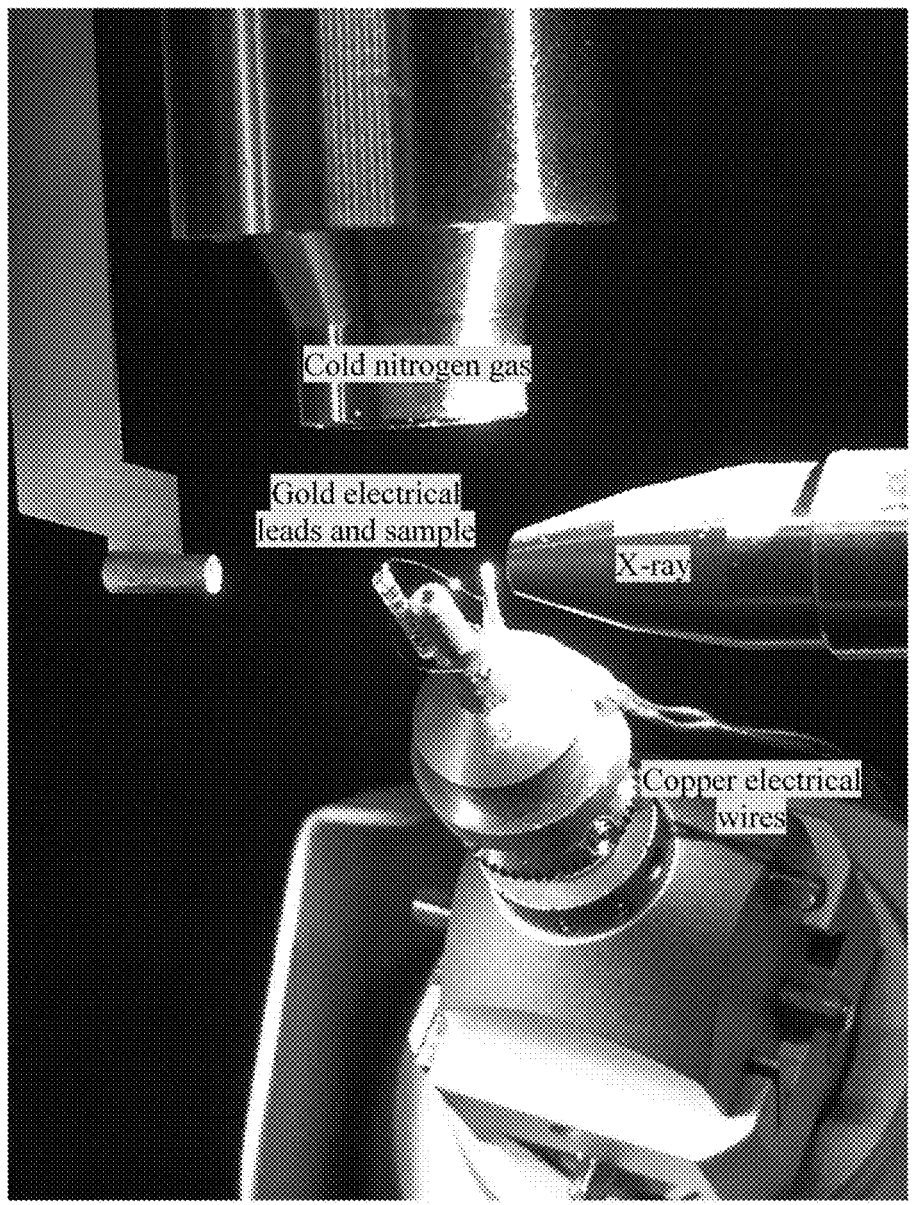
FIG. 6 illustrates an exemplary single-crystal x-ray diffraction of $Sr_2IrO_4$ with current applied within the basal plane of the crystal.

In an example embodiment of the present technology, single crystals of $Sr_2IrO_4$ and $Sr_2Ir_{0.97}Tb_{0.03}O_4$ were grown using a self-flux method from off-stoichiometric quantities of $IrO_2$, $SrCO_3$, $SrCl_2$ and $Tb_4O_7$. Measurements of crystal structures were performed using a Bruker D8 Quest ECO single-crystal diffractometer that features the PHOTON 50 CMOS detector, and is capable of high-speed data collection in shutterless operation mode ensuring excellent quality of data. It is also equipped with an Oxford Cryosystem that creates sample temperature environments ranging over 90 K to 300 K during x-ray diffraction measurements. Single crystals used in x-ray diffraction measurements under applied electrical current had typical dimensions 0.8×0.8×0.2 $mm^3$. The electrical current was applied via two electrical leads (0.001-inch diameter gold wires) that were mounted on the basal plane, or along the c-axis of a single-crystal, which was then mounted on the tip of the sample holder for x-ray diffraction measurements (see FIG. 6).

A Keithley 6220 Precision Current Source provided electrical currents up to 105 mA to the sample while x-ray diffraction data were collected. The structural analysis was performed using APEX3 (v2016.9). The shifts in Bragg peaks are reversible in current cycling. No structural phase transition is discerned, as no new peaks emerge, and no existing peaks completely vanish. In addition, the lattice responds strongly to current in the basal plane, but remains essentially unchanged when current is applied along the c-axis, which suggests that the orientation of the magnetic moments, which lie in the basal plane, is important, and that Joule heating is not affecting the data. The latter conclusion is confirmed by the lack of differences between data taken by either slowly (ramping rate at 5 mA/step), or quickly (105 mA/step) increasing, current from zero to 105 mA.

Standard four-lead measurements of the electrical resistivity and I-V curves were carried out using a Quantum Design Dynacool PPMS System equipped with a 14-Tesla magnet. The differential resistance, dV/dI, was also measured as a function of bias current using a technique offered by the Quantum Design Dynacool PPMS System. Magnetic properties were measured using a Quantum Design MPMS-7 SQUID Magnetometer; the sample was mounted on a probe that has electrical leads. The background of the probe with the leads and corresponding current was subtracted in each set of the magnetic data. The current source was also provided by the Keithley 6220 Precision Current Source. For these magnetic measurements, the applied magnetic field (H) and electrical current (I) were always parallel to the a-axis of the crystal.

A Joule Heating Effect Is Eliminated by the Following Observations and Facts:
(1) Joule heating is a local effect whereas the current-induced $\Delta a/a$ is a bulk or global effect.
(2) Current-induced $\Delta a/a$ and $\Delta c/c$ are anisotropic (FIG. 2A).
(3) Current-induced $\Delta a/a$ closely tracks magnetization (FIG. 2A). That $\Delta a/a$ for the insulating but paramagnetic $Sr_2Ir_{0.97}Tb_{0.03}O_4$ is considerably smaller further confirms the essential role of long-range order in the current-induced $\Delta a/a$ (FIG. 2B) eliminates a role of Joule heating.
(4) The conventional thermal expansion of the a-axis from 90 K to 300 K, $\delta a/a$, is only than 0.1% (FIGS. 2C and 2D), much smaller than $\Delta a/a$, which is about 1% (FIG. 2A).
(5) There are no differences between data taken by either slowly, or quickly increasing, current from zero to 105 mA.

The lattice changes due to applied current are also accompanied by a subtle color and size change of the sample, as seen under a polarizing microscope. A single-crystal $Sr_2IrO_4$ with two electrical leads were examined under an Olympus polarizing microscope with a CCD camera. A Keithley 6220 Precision Current Source provided the current source. The reflectivity change, which is subtle, signals a change in electronic structure due to the current.

Novel materials, which often exhibit surprising or even revolutionary physical properties, are necessary for critical advances in technologies that affect the everyday lives of people. Transition metal oxides are currently the subject of enormous activity within both the applied and basic science communities. The overwhelming balance of interest was devoted to 3d-elements and their compounds for many decades, and the heavier 4d- and 5d-elements and their oxides have received increased attention only recently. Although strong spin-orbit interactions (SOI), which are proportional to the square of atomic number, $Z^2$ (often $Z^4$ in the literature) has been known for many decades to have fundamental and technological importance in the case of the 4f lanthanides and 5f actinides, they were justifiably ignored in studies of 3d-electron materials. What has not been widely appreciated is that 4d- and 5d-elements and their compounds exhibit a unique competition between fundamental Coulomb correlations, crystalline electric field and SOI, which results in unusual physical behaviors and interesting empirical trends that markedly differ from their 3d counterparts.

The 4d and 5d materials such as ruthenates and iridates exhibit particularly strong and surprising influences of SOI on their physical properties. A unique interplay of on-site Coulomb repulsion, U, and strong SOT has intriguing consequences in 5d-based iridates. An early, important manifestation of this interplay is the $J_{eff}=\frac{1}{2}$ Mott state identified in $Sr_2IrO_4$, whose defining characteristic is that the SOI can rigidly lock magnetic moments to the lattice, leading to novel magnetic and electronic behavior.

Electrical-current control of structural and physical properties is a long-sought, but elusive goal of contemporary science and technology. Various embodiments of the present technology demonstrate that a combination of strong SOI and a canted antiferromagnetic (AFM) Mott state is sufficient to attain this important goal. The AFM insulator $Sr_2IrO_4$ provides a model system in which intrinsically strong SOI locks canted Ir magnetic moments to $IrO_6$-octahedra, causing them to rigidly rotate together. A novel coupling between an applied electrical current and the canting angle reduces the Néel temperature and drives a large, non-linear lattice expansion that closely tracks the magnetization, increases the electron mobility, and precipitates a unique resistive switching effect. Various embodiments of the present technology suggest that similar current-controlled behavior may be widespread and present in other antiferromagnetic Mott insulators having strong SOI.

Simultaneous control of structural and physical properties via electrical current is a rare, but extremely desirable contemporary goal because of its great technological potential. In particular, the technical effect of the present technology may be relevant to memory technologies. Traditional memory technologies based on charge storage along with magnetic and ferroelectric random-access memories are rapidly approaching physical or miniaturization limits. As memory technologies based on charge storage shrink, they approach a limit where they become too small to hold sufficient charge to operate as a memory. Alternatively, nonvolatile memory (NVM) concepts can be based on electrically switchable resistance, such as those demonstrated by various embodiments of the present technology, rather than charge storage; and NVMs utilizing resistive switching effects constitute a promising alternative as resistance random access memory or RRAM.

In short, various technical effects of the present technology open new avenues for understanding the fundamental physics of strong SOI in condensed matter, and, equally importantly, provide a new paradigm for the development of an entire class of current-controlled materials to underpin functional devices. For example, computing devices using current-controlled materials for storage, such as those demonstrated by various embodiments of the present technology, may be much smaller than current charge-based memory technologies. Many other electronic devices may be constructed using the present technology to implement many different computing and/or other electrical, mechanical, and magnetic functions, including sensors, actuators, and the like.

$Sr_2IrO_4$ is the archetype, SOI-driven insulator with $T_N$=240 K, and an electronic energy gap $\Delta \leq 0.62$ eV. It crystallizes in a tetragonal structure with space-group $I4_1/acd$ (No. 142) with a=b=5.4846 Å and c=25.804 Å at 13K. Recent studies suggest a further reduced space group $I4_1/a$ (No. 88) for $Sr_2IrO_4$. Two signature characteristics of $Sr_2IrO_4$ are essential for understanding the results presented here: (1) Rotation of the $IrO_6$-octahedra about the c-axis by approximately 12°, which corresponds to a distorted in-plane Ir1-O2-Ir1 bond angle θ, has a critical effect on the ground state. (2) The magnetic structure is composed of ordered moments (0.208 $\mu_B$/Ir) canted within the basal plane. The 13° canting of the moments away from the a-axis closely tracks the staggered rotation of the $IrO_6$ octahedra (see FIG. 7), which sharply contrasts the behavior of 3d oxides.

Figures 7A, 7B, 7C:
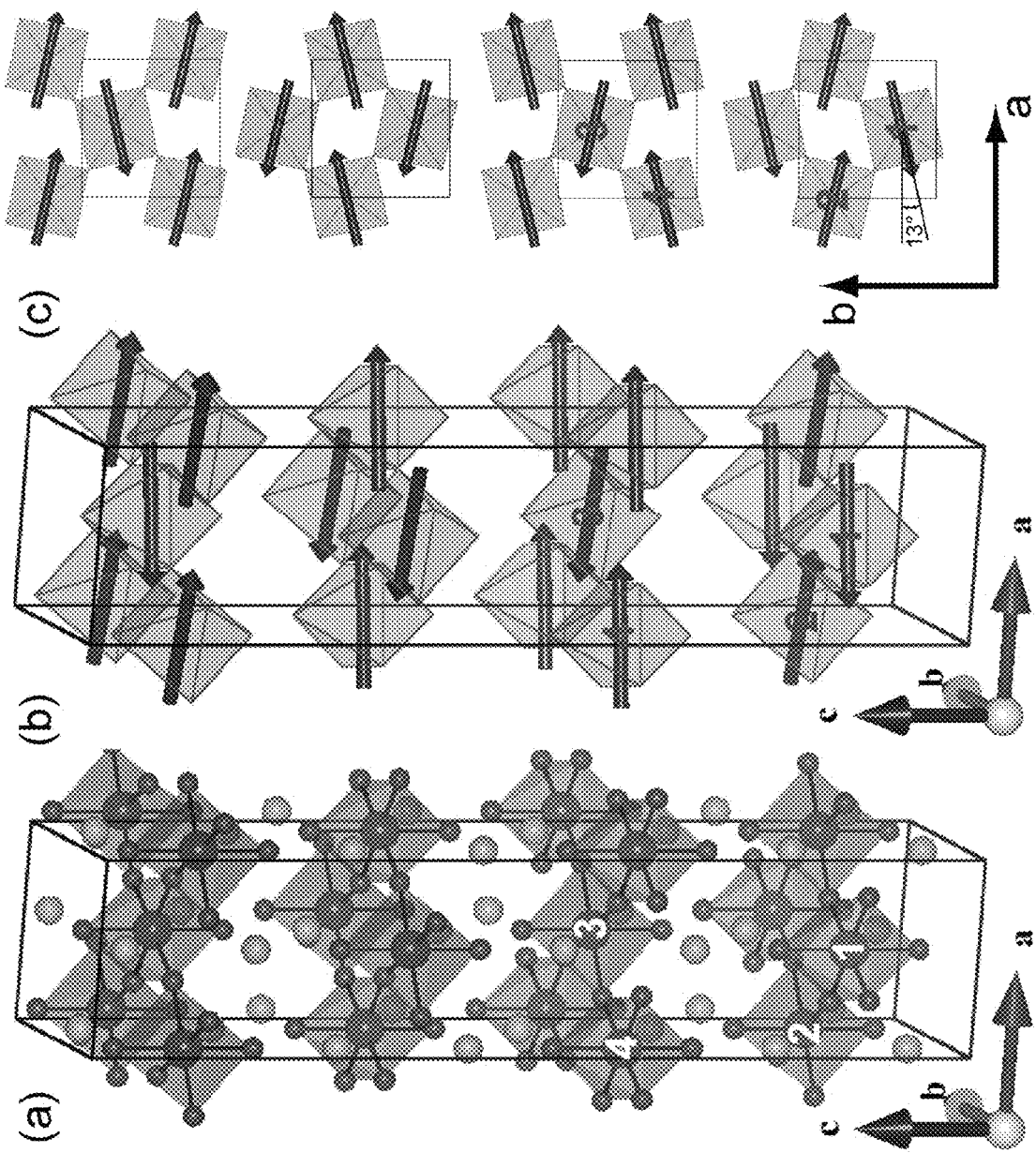
FIGS. 7A-7C illustrate the crystal structure of $Sr_2IrO_4$.

FIGS. 7A-7C illustrate the crystal structure of $Sr_2IrO_4$. FIG. 7A illustrates the crystal structure of $Sr_2IrO_4$. Each $IrO_6$ octahedron rotates 11.8° about the c-axis. The Jr atoms of the non-primitive bases are labeled 1, 2, 3, and 4 plus the body centering translation (½, ½, ½). FIG. 7B illustrates the refined magnetic structure from single-crystal neutron diffraction measurements. FIG. 7C illustrates the same magnetic moment configuration projected on the basal planes.

The relationship between the rotation of the $IrO_6$ octahedra and magnetic moment canting in the iridates was first discussed in an earlier reference, in which a theoretical model proposed a strong magnetoelastic coupling in $Sr_2IrO_4$, and a close association between the magnetic moment canting and the ratio of the lattice parameter of the c-axis to the a-axis, as a consequence of the strong SOI. Indeed, the strong locking of the moment canting to the $IrO_6$-rotation (by 11.8°) is experimentally manifest in studies of x-ray resonant scattering and SHG. In particular, the SHG study indicates that the I41/a space group requires a staggering of the sign of the tetragonal distortion ($\Delta_1$ and $\Delta_2$), which helps explain the magnetoelastic locking, as illustrated in FIGS. 8A-8D.

Figures 8A, 8B, 8C, 8D:
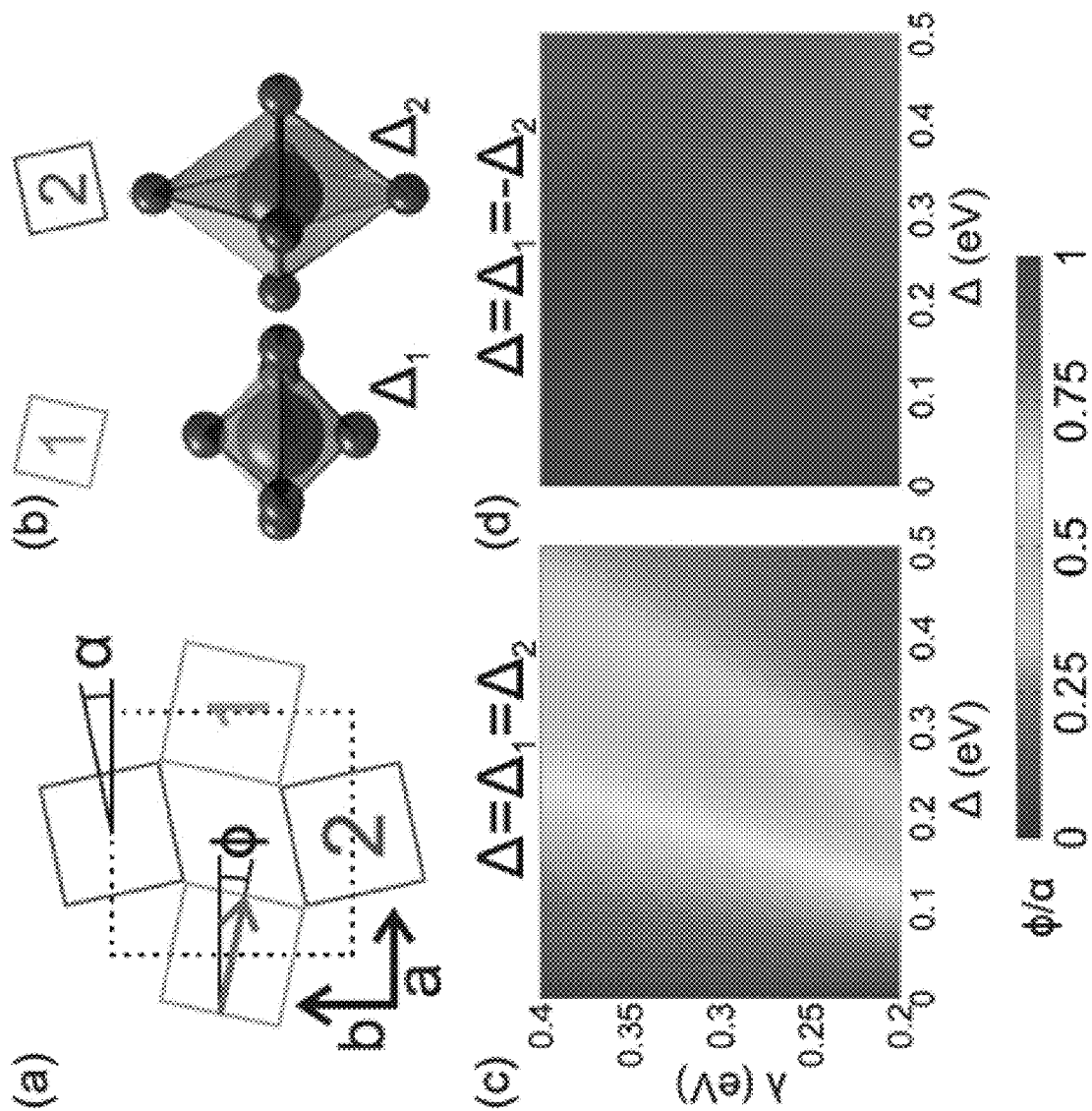
FIGS. 8A-8D illustrate an $IrO_2$ plane.

FIGS. 8A-8D illustrate an $IrO_2$ plane. FIG. 8A illustrates an $IrO_2$ plane. The oxygen octahedra rotate about the c-axis by creating a two-sublattice structure. The magnetic moments couple to the lattice and exhibit canting angles φ. FIG. 8B illustrates an unequal tetragonal distortion $\Delta_1$ and $\Delta_2$ on the two sublattices as required by the $I4_1/a$ space group. FIGS. 8C and 8D illustrate the ratio φ/α as a function of both SOI and Δ calculated for the case of uniform (FIG. 8C) and staggered (FIG. 8D) ($\Delta_1$=$-\Delta_2$) tetragonal distortion assuming U=2.4 eV, Hund's coupling $J_H$=0.3 eV, hopping t=0.13 eV, and α=11.5°.

A representative diffraction pattern taken with the basal plane of $Sr_2IrO_4$ nearly perpendicular to the incident x-ray beam is shown in FIG. 1A. The Bragg peaks for Miller indices (220) or (0016) are representative for the discussion that follows. The position and intensity of the (0016) peak for temperature T=200 K are shown in FIG. 1B and FIG. 1C, respectively, and undergo remarkable changes upon the application of basal-plane electrical currents (I) up to 105 mA. The (0016) peak shifts up and to the right with a threefold reduction in intensity that is sensitive to the atomic positions within a unit cell (FIG. 7C). Other Bragg peaks exhibit similar shifts with current, and either enhanced or reduced intensities, which reflects changing interference generated by shifts in atom positions. The lattice changes due to current are also accompanied by a subtle but visible color and size change of the sample, as seen with the aid of a polarizing microscope.

The current-controlled changes in the a- and c-axis were quantitatively characterized by x-ray diffraction for current applied either to the basal plane or along the c-axis. The lattice responds more strongly to current in the basal plane than along the c-axis, which suggests that the orientation of the Ir moments is important, and that Joule heating is not affecting the data.

Focusing on normalized changes in the a- and c-axis lattice parameters $\Delta a/a$ and $\delta c/c$ with basal-plane I, where $\Delta a/a=[a(I)-a(0)]/a(0)$, and 0 mA≤I≤105 mA; $\Delta c/c$ is similarly defined. FIG. 2A shows $\Delta a/a$ peaks at nearly 1% near $T_N$, then decreases to 0.2% at 300 K, whereas $\Delta c/c$<0.1%. The clear difference between $\Delta a/a$ and $\Delta c/c$ once again does not support a Joule heating effect, and further confirms an important role for the in-plane Ir moments. The temperature dependence of $\Delta a/a$ closely tracks that of the a-axis magnetization, $M_a$, (FIG. 2A); this is direct evidence that the current-controlled expansion of the a-axis involves interlocking of cooperative magnetic order and the lattice. In some embodiments, the reduced magnetic canting must be accompanied by a simultaneous, increased θ, which is critical in determining the ground state.

The current-controlled a-axis expansion is expected to be strongly associated with long-range AFM order. A parallel study of $Sr_2Ir_{0.97}Tb_{0.03}O_4$ shows that a 3% replacement of $Ir^{4+}$ by $Tb^{4+}$ leads to a disappearance of $T_N$, but conveniently retains the insulating state and the original crystal structure. The absolute values of $\Delta a/a$ and $\Delta c/c$ for $Sr_2Ir_{0.97}Tb_{0.03}O_4$ for I=105 mA are small (<0.2%) and weakly temperature-dependent in the absence of AFM order (FIG. 2B). A comparison of FIGS. 2A and 2B clearly points to an essential role played by long-range AFM in the current-controlled lattice expansion, and further eliminates a Joule heating effect.

The conventional thermal expansion of $Sr_2IrO_4$ was also measured without application of current. The temperature dependence of the a- and c-axis and their corresponding changes $\delta a/a$ and $\delta c/c$ due to pure thermal expansion ($\delta a/a=[a(T)-a(90K)]/a(90K)$ and $\delta c/c$ is similarly defined) shows that the a-axis expands linearly and only slightly (~0.1%) from 90 K to 300 K (FIGS. 2C and 2D). The corresponding coefficient of linear thermal expansion $\alpha$=1/a (da/dT) is approximately $5.0 \times 10^{-6}$ $K^{-1}$, which is small and comparable to those of many materials. The small thermal expansion of $Sr_2IrO_4$ is also consistent with its high melting point (>1900° C.), which reflects bond energies on the order of electron volts. The sharp contrast between the conventional thermal expansion $\delta a/a$ (0.1%) and the novel current-controlled $\Delta a/a$ (~1%) highlights the extraordinary coupling between current and the AFM state.

Significant changes in the a-axis magnetic susceptibility $\chi_a(T)$ and the a-axis magnetization $M_a$ are also observed when current is applied (FIGS. 3A-3D). $T_N$ is drastically decreased by 40 K for I=80 mA (FIGS. 3A and 3B) and the value of $M_a$ is reduced by 16% (FIGS. 3C and 3D). Magnetic canting is ascribed to a Dzyaloshinsky-Moriya interaction that is closely associated with θ; the canting decreases with increasing θ and vanishes when θ=180°. This is consistent with the reduced $M_a$ that signals enhanced itinerancy due to the increased θ.

Another prominent consequence of the current-controlled lattice expansion is non-Ohmic behavior that features a negative differential resistance (NDR). NDR is a nonlinear phenomenon with a ratio of voltage to current $\Delta V\Delta/I$<0, contrary to Ohm's law, which describes a linear relationship between V and I, thereby a positive resistance or $\Delta V\Delta/I > 0$. The phenomenon is in general attributed to either an "electrothermal" effect or a "transferred carrier" effect. The more common form of NDR is manifest in "N"-shaped I-V characteristics. Alternatively, an "S"-shaped NDR has been observed in various memory devices and a few bulk materials such as $VO_2$, $CuIr_2S_{4-x}Se_x$, $Ca_3Ru_2O_7$ and $1T\text{-}TaS_2$. These bulk materials are characterized by a first-order metal-insulator transition (MIT) and, except for $Ca_3Ru_2O_7$, are without an AFM state. The "S"-shaped NDR in these materials is closely associated with the first-order MIT, and attributed to drastic differences in crystal and electronic structures below and above MIT.

Contrasting the above materials, $Sr_2IrO_4$ features a prominent AFM order and a Mott insulating state that persists up to at least 600 K without a MIT, indicating a different mechanism that drives the NDR. The "S"-shaped NDR was observed in an earlier study of $Sr_2IrO_4$ but the underlying mechanism remained unclear up to now. The I-V curves for current applied along either the a- or c-axis at a few temperatures are presented in FIGS. 4A and 4B, along with the strong anisotropy of the response in FIG. 4C. A linear I-V response during an initial current ramp is followed by a sharp threshold voltage $V_{th}$ that marks a switching point where voltage abruptly drops with increasing current, thus signaling a NDR. Another broad turning point emerges with further current increase, and is more distinct in the c-axis I-V curves for T<100 K.

A plot of $V_{th}$ as a function of temperature displays a pronounced slope change near 100 K, where an anomaly in $M_a$ occurs (FIG. 4D). Previous studies have shown that $M_a$ undergoes two additional anomalies at $T_M$ 100 K and 25 K (FIG. 4D), due to moment reorientations, which is corroborated by a muon-spin rotation and relaxation study. Note that the increased scatter in the a- and c-axis values between 100 K and 150 K in FIGS. 2C and 2D are most likely due to the reorientation of the Ir moments, and are at the root of the unusual magnetoresistivity and magnetoelectric behavior. That this magnetic reorientation separates the different regimes of I-V behavior below and above $T_M \approx 100$ K suggests a close relation between the magnetic state and the I-V characteristics (FIG. 4D).

The NDR behavior exhibited by $Sr_2IrO_4$ reflects a novel mechanism that fundamentally differs from that operating in other materials. This is based on constructing a picture that self-consistently explains the complex NDR behavior, and the current-controlled expansion and magnetization data. Begin by examining the a-axis resistivity $\rho_a$ that drops by nearly three orders of magnitude at low temperatures (FIG. 4E) and the corresponding activation energy gap estimated from 100-270 K decreases from 81 meV to 32 meV as current increases from 0.1 mA to 20 mA. There is a clear drop of $\rho_a$ with decreasing temperature after peaking around 11 K (FIG. 4E Inset), indicating an incipient metallic state. The representative differential resistance, dV/dI, at 100 K reveals two anomalies near 10 mA and 45 mA, marked as $I_{C1}$ and $I_{C2}$, respectively (FIG. 4F).

Corresponding I-V curves at 100 K feature a sharp switching point $(V_{th})$ at $I_{C1}$ and a broader turning point near $I_{C2}$ (FIG. 5A). It is crucial to note that the current-controlled a-axis expansion $\Delta a/a$ closely tracks the I-V curves with non-linear changes at $I_{C1}$ and $I_{C2}$, respectively (upper horizontal axis in FIG. 5A). The slope changes in $\Delta a/a$ signal successively more rapid expansions of the a-axis at $I_{C1}$ and $I_{C2}$, each accompanied by a more significant increase in $\theta$, which, in turn, enhances electron hopping (FIG. 5B). As the current further increases above $I_{C2}$=45 mA, $\Delta a/a$ appears to saturate. This explains why a magnetic field (H) reduces voltage considerably only between $I_{C1}$ and $I_{C2}$, but shows no visible effect above $I_{C2}$ (see green curve in FIG. 5A) because magnetic field can only increase $\theta$ via realigning the Ir moments below $I_{C2}$: Above $I_{C2}$, the saturation of $\Delta a/a$ corresponds to $\theta$ approaching 180°, which precludes further increases, and magnetic field can therefore no longer affect the I-V curves. The close association between $\Delta a/a$, moment canting and the I-V curves reveals how current-controlled basal-plane expansion drives the nonlinear I-V characteristics.

Fundamentally, the formation of the Mott insulating state with canted $IrO_6$-octahedra and canted moments is caused by a cooperative transition in which the electronic structure gaps, thereby lowering its energy relative to the paramagnetic metallic state. The gapping mechanism involves electronic correlations that involve both spin-orbit coupling and scattering through the magnetic reciprocal lattice vector. The electronic correlation is expected to manifest itself in the unoccupied states (electron-carrier) and in the occupied (hole-carrier) states. The momentum shift associated with a finite current is usually negligible in uncorrelated systems but, in correlated systems close to quantum critical points, theory shows that relatively small changes in the low-energy electronic structure can cause large (non-linear) changes in the ordered structure. In short, a slight modification of the electronic structure induced by current may result in strong modifications of the electronic correlations. The NDR data is interpreted in terms of a reduction in the gapping, as suggested in FIG. 4E, and the concomitant decrease in the carriers' effective masses induced by current.

A combination of strong SOI and canted AFM order can lead to a highly desirable paradigm for simultaneous electrical control of the crystal structure and physical properties of $Sr_2IrO_4$: (1) Strong SOI lock canted Ir moments to the $IrO_6$-octahedra, which rigidly rotate together (FIGS. 1 and 7). (2) Strong SOI dictate the low-energy Hamiltonian and creates small gaps in the electronic structure, which ultimately affect electron mobility (i.e., an increase in $\theta$ favors electron hopping; see FIGS. 3 and 4). (3) Applied current effectively drives a lattice expansion by increasing $\theta$ and reducing small gaps in the electronic structure (FIG. 4E), which also reduces $T_N$ and the Ir moments (FIG. 2). Similar behavior may be widespread and present in other iridates.

Various embodiments of the present technology demonstrate that electrical control of both crystal structures and collective electron states, which is extremely rare but long-sought in contemporary condensed matter research because of the great technological importance, can be achieved in materials that possess two key elements: strong SOI and a canted AFM Mott state. It is particularly encouraging that these two key elements are commonplace in a large number of heavy transition metal oxides.

Various embodiments of the current-controlled material must possess the following two characteristics simultaneously: (1) Relatively strong SOI; and (2) Canted AFM Mott insulators.

The strong SOI makes a strong locking of magnetic moments and $TO_6$-octahedra (T=4d or 5d transition metal element) possible. A canted AFM state allows room for rotations of the canted moments. Applied electrical current (I) couples to the canted magnetic moments. Because of the strong locking of canted magnetic moments and $TO_6$-octahedra due to SOI, and current can cause them to rigidly rotate together, or effectively tune the T-O-T bond angle $\theta$, thus physical properties. These two essential requirements for current-controlled materials are also summarized in the Table 1.

TABLE 1

Two Essential Requirements for Current-Controlled Behavior

| Essentials | Specifics | Exemplary Materials |
|---|---|---|
| Relatively Strong SOI | 0.15 eV-0.5 eV (4d-5d) | $Sr_2IrO_4$, $BaIrO_3$, $Ca_3Ru_2O_7$ and doped $Ca_2RuO_4$ |
| Canted AFM Insulator | Canted moments track distorted bond angle θ | |

Figure 9A:
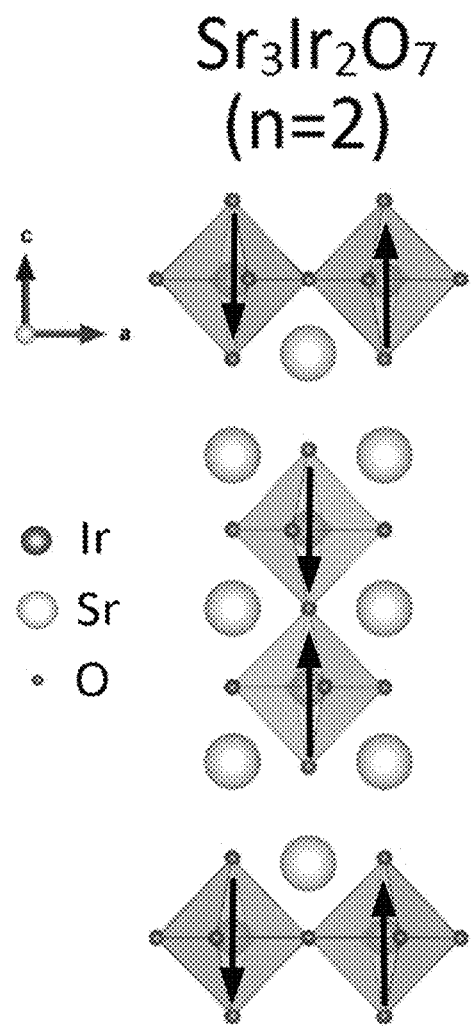
FIGS. 9A and 9B illustrate the crystal structure of $Sr_3Ir_2O_7$.
Figure 9B:
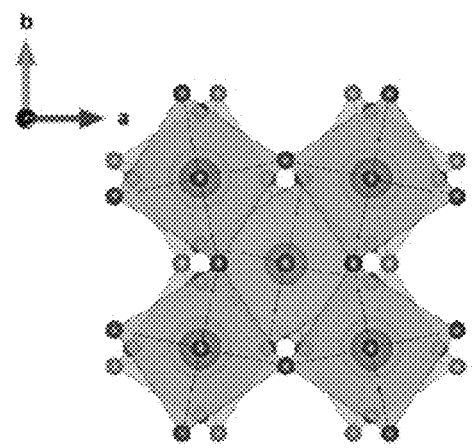
Figure 9C:
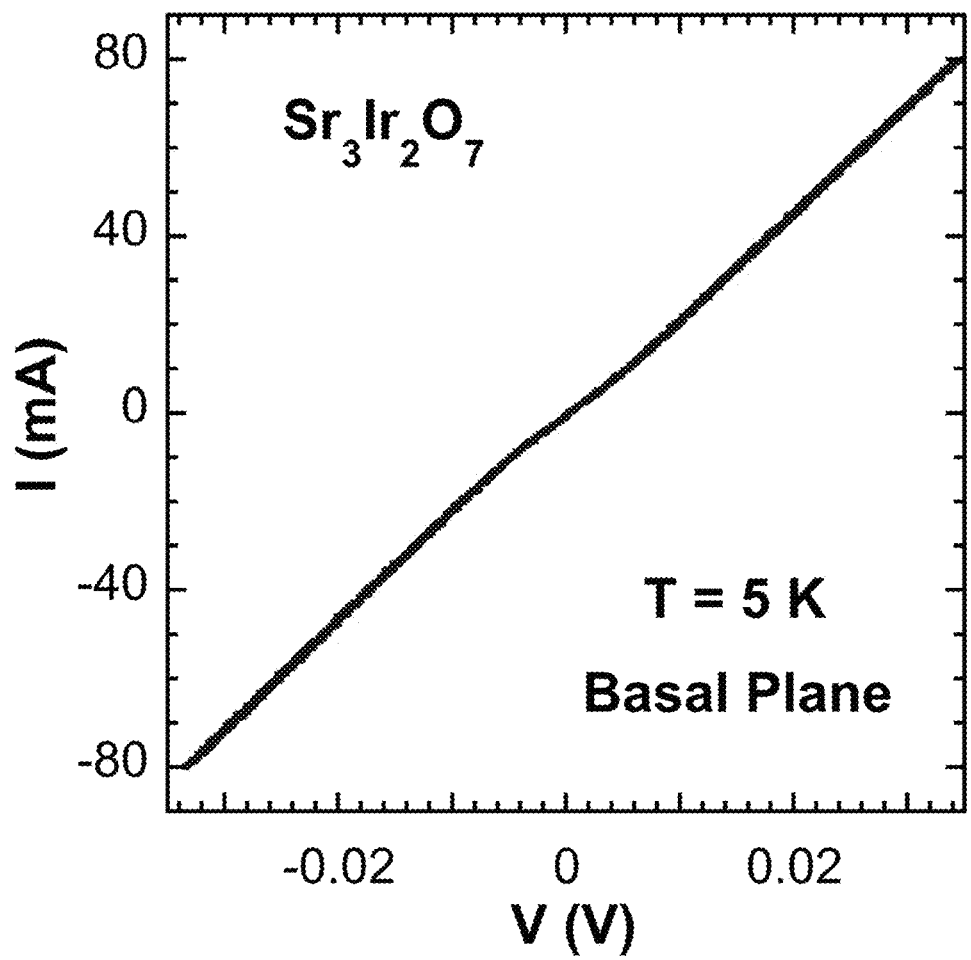
FIG. 9C illustrates the I-V curve for the basal plane culled at 5 K.

FIGS. 9A and 9B illustrate the crystal structure of $Sr_3Ir_2O_7$ for (FIG. 9A) the ac-plane; the magnetic moments along the c-axis are denoted by black arrows, and (FIG. 9B) the ab- or basal plane. This is an example to demonstrate that the canted moments must track the octahedral rotation. FIG. 9C illustrates the I-V curve for the basal plane culled at 5 K.

$Sr_3Ir_2O_7$ is a sister compound of $Sr_2IrO_4$, the model system. It is an AFM insulator with $T_N$=285 K and equally strong SOI and similar $IrO_6$ octahedral rotation to that in $Sr_2IrO_4$ but the magnetic moments in $Sr_3Ir_2O_7$ are aligned along the c-axis, rather than within the basal plane where the octahedral rotation occurs (see FIGS. 9A and 9B). As a result, applied current (I) cannot exert any effect on the lattice because the collinearly aligned magnetic moments along the c-axis are not energetically favorable to rotate or to drive an octahedral rotation in the basal plane (the moments does not track the $IrO_6$ rotation). Therefore, it is not surprising that $Sr_3Ir_2O_7$ does not at all show current-controlled behavior observed in its sister compound $Sr_2IrO_4$. For example, the I-V curves are nearly linear or Ohmic (see FIG. 9C), sharply contrasting the "S-shaped" I-V characteristic in $Sr_2IrO_4$ (FIG. 5). This example not only further illustrates the necessity of the two essential characteristics (namely, SOI and Canted AFM Mott Insulating State) for current-controlled behavior but also helps validate the central mechanism that drives this class of novel materials.

It is emphasized that both conditions described above must be met simultaneously otherwise current control cannot be established. $Sr_3Ir_2O_7$ serves an excellent example: It is an AFM insulator with the equally strong SOI and similar $IrO_6$ octahedral rotation to that in $Sr_2IrO_4$ (FIGS. 6 and 7) but the magnetic moments in $Sr_3Ir_2O_7$ are aligned along the c-axis, rather than within the basal plane where the octahedral rotation occurs (see FIGS. 9A and 9B). As a result, applied current cannot exert any effect on the lattice because the collinearly aligned the magnetic moments, which is coupled with current, have no room to rotate. Therefore, it is not surprising that $Sr_3Ir_2O_7$ does not at all show current-controlled behavior observed in its sister compound $Sr_2IrO_4$. For example, the I-V curves are nearly linear or Ohmic (see FIG. 9C), sharply contrasting the signature "S-shaped" I-V characteristic in its sister compound $Sr_2IrO_4$ (FIG. 4). This example not only further illustrates the necessity of the two essential characteristics for current-controlled behavior but also help validate the central mechanism that drives this class of novel materials.

Various embodiments of the present technology provide for a number of promising candidate materials besides $Sr_2IrO_4$.

Iridate $BaIrO_3$. $BaIrO_3$ with space group of C2/m features three face-sharing $IrO_6$ octahedra forming $Ir_3O_{12}$ clusters that are vertex-linked via $IrO_6$ octahedra to construct one-dimensional (1D) chains along the c-axis (see FIG. 10).

Figure 10:
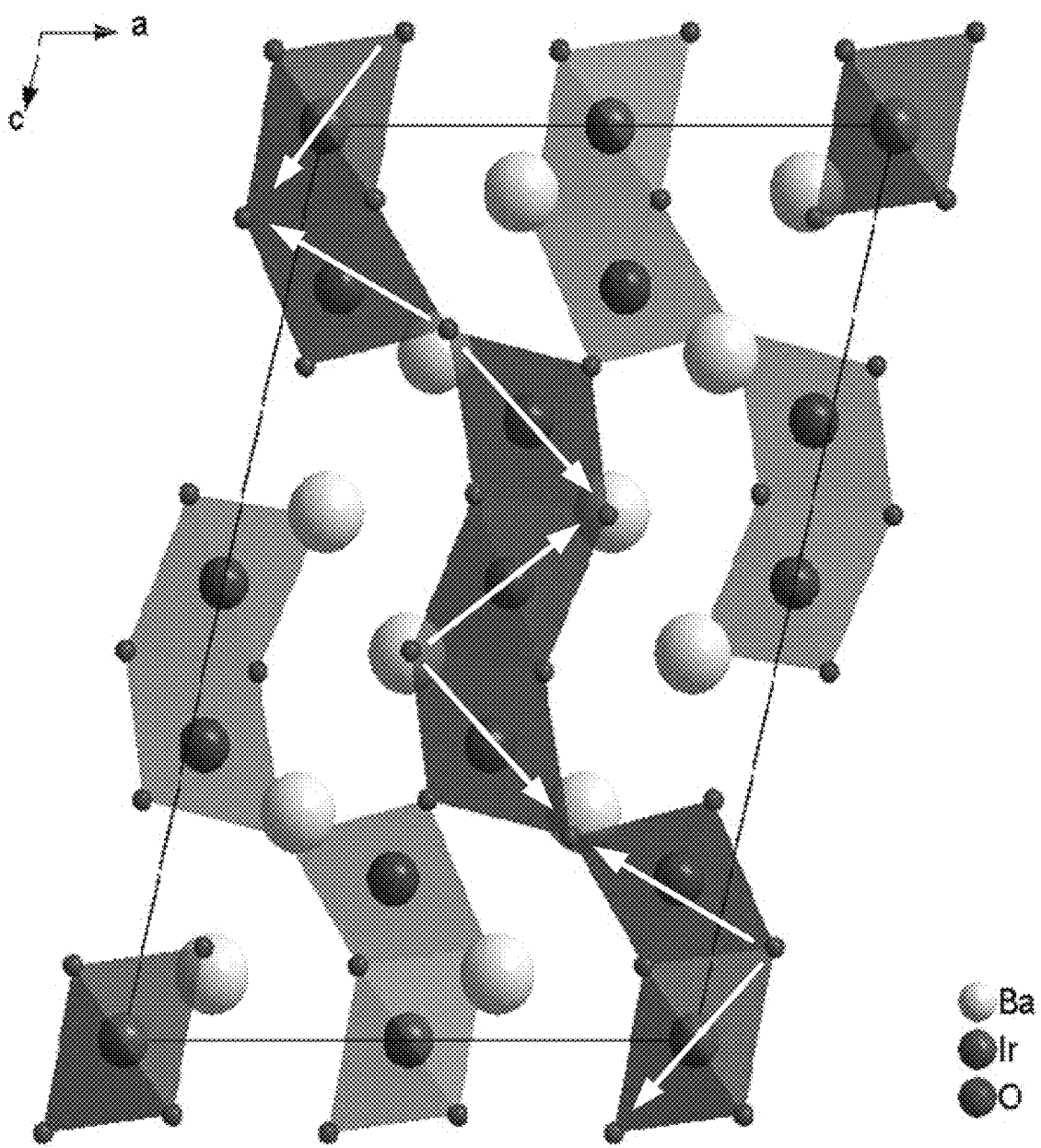
FIG. 10 illustrates monoclinic $BaIrO_3$.

FIG. 10 illustrates monoclinic $BaIrO_3$: a=10.0052 Å, b=5.7514 Å, c=15.1742 Å. The crystal structure features $Ir_3O_{12}$ cluster trimers along the c-axis. The canted magnetic moments are denoted by white arrows.

Figures 11A, 11B:
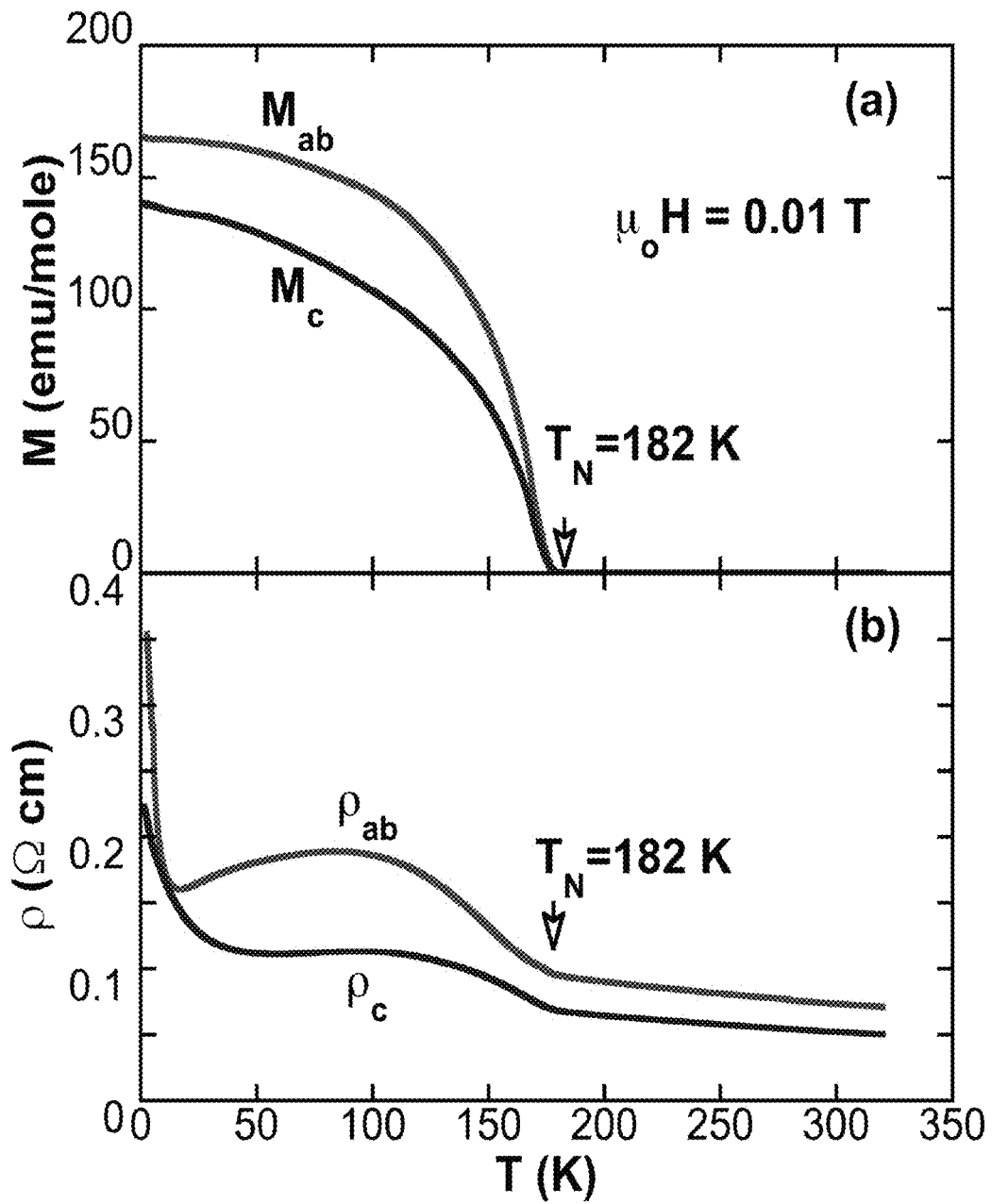
FIGS. 11A and 11B illustrate the temperature dependence of $BaIrO_3$.

It adopts a monoclinic distortion generating twisting and buckling of the cluster trimers that are titled (~12° relative to each other) and give rise to two 1D zigzag chains along the c-axis and a layer of corner sharing $IrO_6$ octahedra in the ab-plane, bringing about both 1D and 2D structural characteristics. $BaIrO_3$ is a canted AFM system with $T_N$=182 K and charge energy gap of 0.1 eV. The underlying structural, magnetic and transport properties, as illustrated in FIGS. 11A and 11B.

FIG. 11 illustrates the temperature dependence of $BaIrO_3$. The temperature dependence of (a) magnetization (M) and (b) electrical resistivity ρ for the a- and c-axis.

The distortions favor a canted magnetic structure in which magnetic moments are primarily aligned along the c-axis, and tracks distorted cluster trimers. This crucial feature along with the strong SOI, as discussed above, makes $BaIrO_3$ a very promising candidate for current-controlled behavior. Indeed, applied current along the c-axis systematically and effectively suppresses both the magnitude of the c-axis magnetization $M_c(T)$ and $T_N$ (see FIG. 12).

Figure 12:
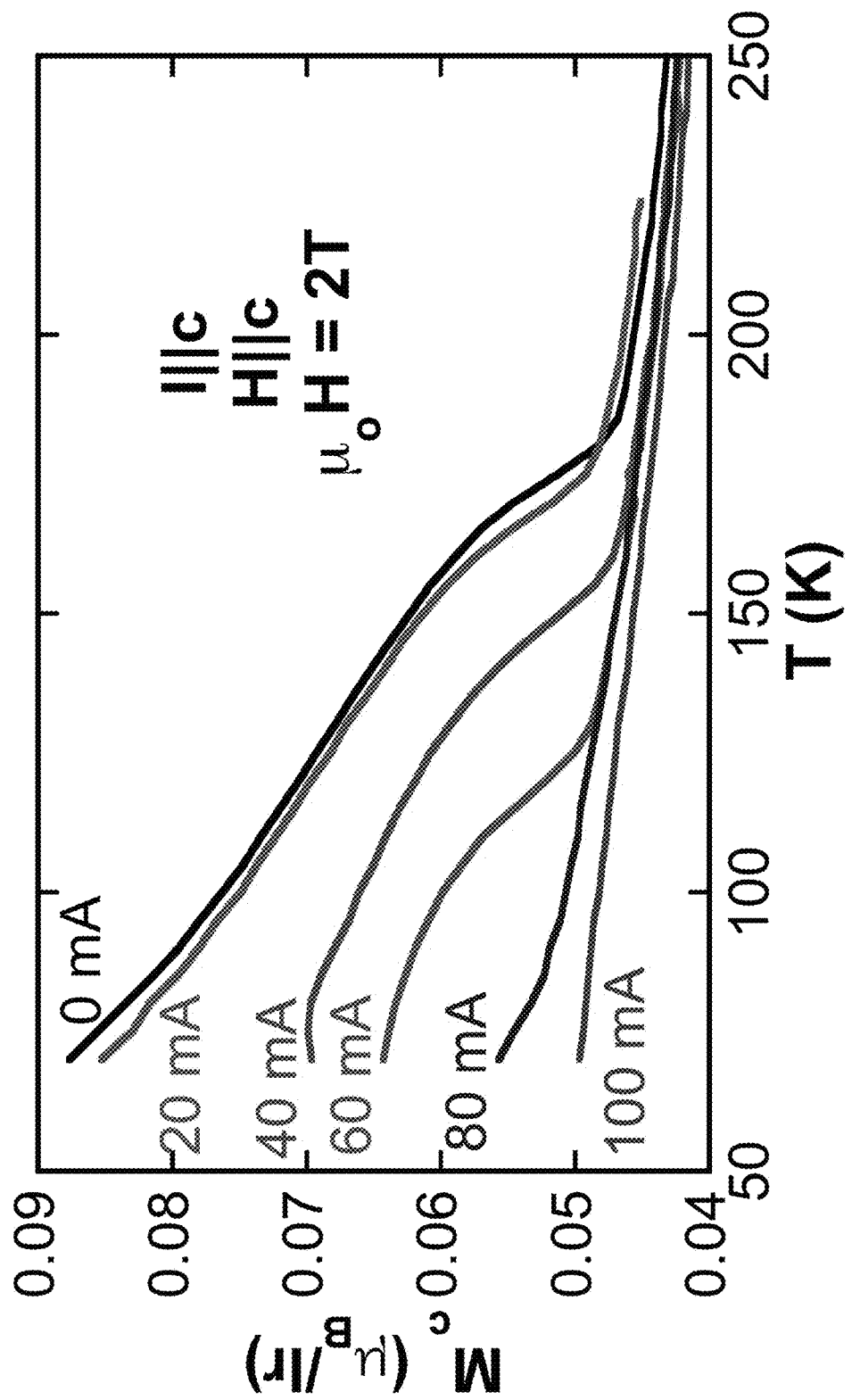
FIG. 12 illustrates the temperature dependence in $BaIrO_3$ of c-axis magnetization $M_c(T)$ at a few representative currents.

FIG. 12 illustrates the temperature dependence in $BaIrO_3$ of c-axis magnetization $M_c(T)$ at a few representative currents. Note that $T_N$ disappears above 70 K due to 100 mA.

Figure 13:
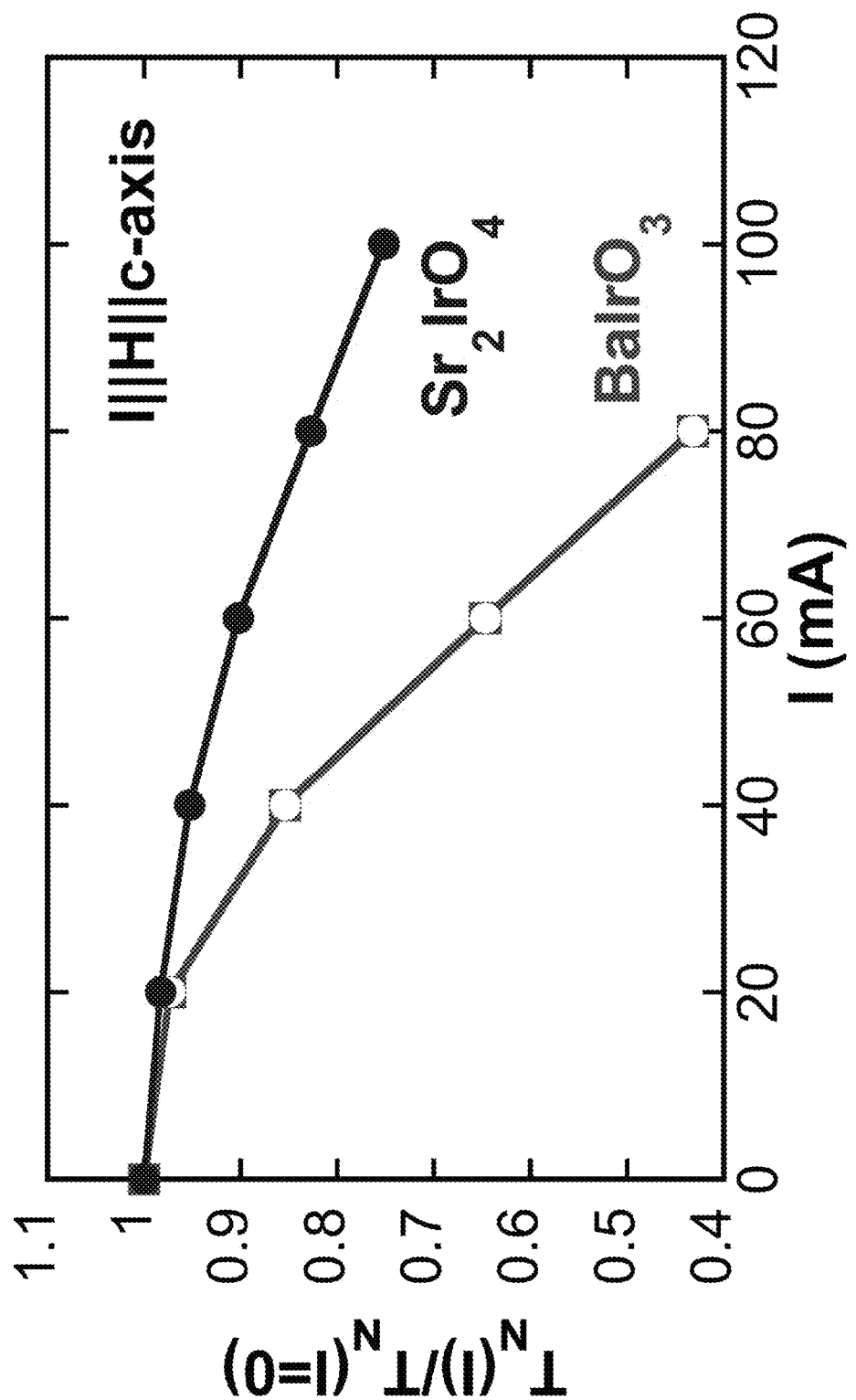
FIG. 13 illustrates normalized $T_N$ as a function of current applied along the c-axis for both $BaIrO_3$ and $Sr_2IrO_4$.

A comparison drawn between $BaIrO_3$ and $Sr_2IrO_4$ indicates that $T_N$ decreases with current remarkably more rapidly in $BaIrO_3$ than in $Sr_2IrO_4$, as illustrated in FIG. 13.

FIG. 13 illustrates normalized $T_N$ as a function of current applied along the c-axis for both $BaIrO_3$ and $Sr_2IrO_4$. Note that $T_N$ decreases more rapidly in $BaIrO_3$ than in $Sr_2IrO_4$. The data are obtained from M(T) data.

Figures 14A, 14B:
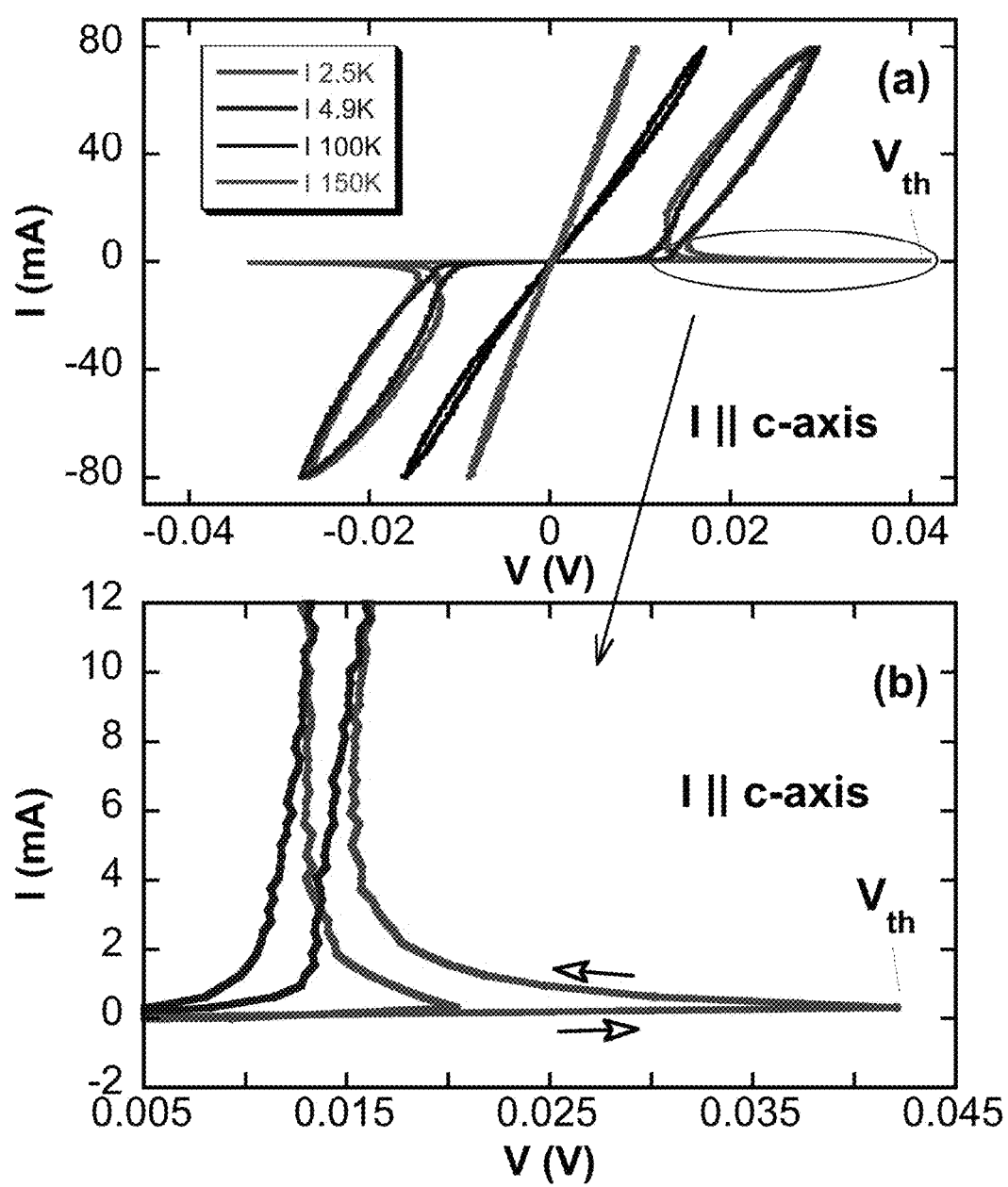
FIGS. 14A and 14B illustrate exemplary I-V curves for $BaIrO_3$.

The S-shaped I-V characteristic in $BaIrO_3$ is strong at low temperatures, and significantly weakens with increasing temperature and vanishes near $T_N$; the Ohmic behavior is eventually recovered about $T_N$. This is illustrated in FIGS. 14A and 14B: (FIG. 14A) I-V curves at a few representative temperatures; and (FIG. 14B) zoomed-in I-V curves to illustrate the sharp threshold $V_{th}$.

Ruthenate $Ca_2RuO_4$ and its derivatives. Some layered 4d-transition metal oxides can be promising candidate materials. The comparable magnitudes of their intra-atomic Coulomb interaction (U) and 4d-bandwidth (W) can leave them precariously balanced on the border between metallic and insulating behavior, and/or on the verge of long-range magnetic order. Therefore, moderately strong SOI, as well as weaker perturbations such as slight changes in lattice parameters, can induce drastic changes in the character of their electronic ground states.

Extensive investigations of $Ca_2RuO_4$ have established that a strong cooperative Jahn-Teller distortion removes the degeneracy of the three Ru $t_{2g}$ orbitals ($d_{xy}$, $d_{yz}$, $d_{zx}$) via a transition to orbital order that, in turn, drives a metal-insulator (MI) transition at $T_{MI}$=357 K. However, $Ca_2RuO_4$ undergoes AFM order at $T_N$=110 K<<$T_{MI}$. $Ca_2RuO_4$ and its derivatives are highly sensitive to the lattice degrees of freedom, and chemical substitutions for Ru can effectively increase or decrease the MI transition. One signature feature that is relevant to this study is that $Ca_2Ru_{1-x}M_xO_4$ (M=Cr, Mn and Fe) exhibits a large negative volume thermal expansion via magnetic and orbital orders.

Figures 15A, 15B:
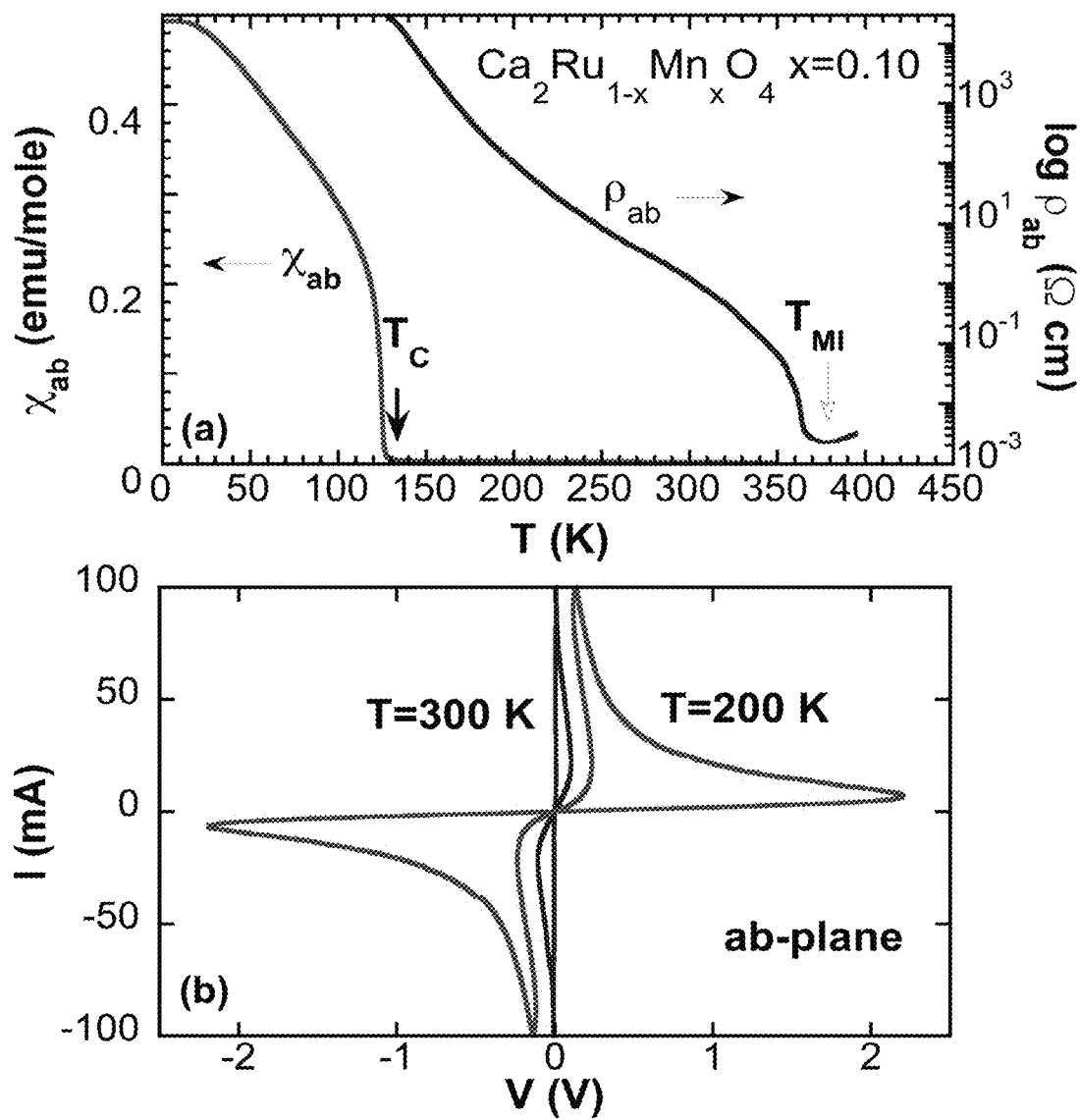
FIGS. 15A and 15B illustrate $Ca_2Ru_{0.9}Mn_{0.1}O_4$.

Nevertheless, these structural and physical properties apparently facilitate the occurrence of the S-shaped I-V characteristics. $Ca_2Ru_{0.9}Mn_{0.1}O_4$ as an example is illustrated in FIGS. 15A and 15B, in which (FIG. 15A) the magnetic susceptibility $\chi_{ab}$ and resistivity $\rho_{ab}$ for the ab plane and (FIG. 15B) the I-V curves for two representative temperatures are presented. The above description and associated figures teach the best mode of the invention.

Simultaneous control of structural and physical properties via applied electrical current poses a key, new research topic and technological significance. Various embodiments of the present technology study the spin-orbit-coupled antiferromagnet $Ca_2RuO_4$, and its derivative with 3% Mn doping to alleviate the violent first-order transition at 357 K for more robust measurements, illustrating that a small applied electrical current couples to the lattice by significantly reducing its orthorhombicity and octahedral rotations, concurrently diminishing the 125 K-antiferromagnetic transition and inducing a new, orbital order below 80 K. An example embodiment of the present technology to establish a phase diagram reveals a critical regime near a current density of 0.15 $A/cm^2$ that separates the vanishing antiferromagnetic order and the new orbital order. Further increasing current density (>1 $A/cm^2$) enhances competitions between relevant interactions in a metastable manner, leading to a peculiar glassy behavior above 80 K. The coupling between the lattice and nonequilibrium driven current is interpreted theoretically in terms of $t_{2g}$ orbital occupancies. The current-controlled lattice is the driving force of the observed novel phenomena. Finally, note that current-induced diamagnetism is not discerned in pure and slightly doped $Ca_2RuO_4$.

4d/5d-electron based oxides with inherent strong spin-orbit interactions (SOI) and significant electronic correlations create an entirely new hierarchy of energy scales and unique competitions between fundamental interactions, which leaves these materials precariously balanced on the border between metallic and insulating behavior, and/or on the verge of long-range magnetic order. As a result, exotic quantum states arise whenever subtle interactions conspire to generate large susceptibilities to small, external stimuli.

The antiferromagnetic (AFM) insulator $Ca_2RuO_4$ is a good example. With $Ru^{4+}(4d^4)$ ions, it exhibits a metal-insulator transition at $T_{MI}$=357 K, which marks a concomitant and particularly violent structural transition with a severe rotation and tilting of $RuO_6$, which governs physical properties of $Ca_2RuO_4$. This transition removes the $t_{2g}$ orbital degeneracy ($d_{xy}$, $d_{yz}$, $d_{zx}$) and leads to orbital order that, in turn, drives the metal-insulator transition at $T_{MI}$. An abrupt AFM transition occurs only at a considerably lower Neel temperature $T_N$=110 K, highlighting its close association with a further distorted crystal structure. Extensive investigations of this system have established that quantum effects are intimately coupled to external stimuli in general and extremely sensitive to lattice perturbations in particular.

Electronic properties of $Ca_2RuO_4$ are sensitive to applied electrical current. More recent investigations report current-induced diamagnetism and current-induced non-equilibrium state. Indeed, it has become increasingly clear that electrical current, which joins magnetic field, pressure, electric field, light, etc. as a new stimulus/probe, controls quantum states in an unprecedented fashion. This is certainly manifest in another embodiment of the present technology that demonstrates simultaneous current-control of structural and physical properties in $Sr_2IrO_4$ featuring strong SOI and a canted AFM state.

Various embodiments of the present technology illustrate structural, magnetic and transport properties as a function of electrical current and temperature in 3% Mn doped $Ca_2RuO_4$, and, for comparison, in pure $Ca_2RuO_4$ and 9% Mn doped $Ca_2RuO_4$. It is emphasized that the dilute Mn doping for Ru preserves essential structural and physical properties of $Ca_2RuO_4$ but weakens the often pulverizing first-order structural phase transition at 357 K, making the single crystals more robust to sustain thermal cycling needed for thorough measurements. Various embodiments of the present technology reveal that a novel coupling between small applied electrical current and the lattice critically reduces the orthorhombicity and the octahedral rotation that in turn precipitously suppress the AFM state and subsequently induce a new orbital order below 80 K at a current density ≥0.15 $A/cm^2$ in pure and Mn doped $Ca_2RuO_4$. Further increasing current density (>1 $A/cm^2$) causes a metastable effect, thus an exotic glassy behavior featuring unusual sample-history dependence above 80 K. Various aspects of the present technology illustrate that nonequilibrium electron occupancies of the $t_{2g}$ orbitals stabilized by applied current drive the critical lattice changes, thus the novel phenomena in this correlated, spin-orbit-coupled system. Various embodiments of the present technology also emphasize the conspicuous absence of current-induced diamagnetism, which is reported to exist in $Ca_2RuO_4$.

The single crystals utilized in various embodiments of the present technology are grown using floating-zone technique. The lattice parameters are measured as functions of electrical current and temperature using both neutron and x-ray diffraction. In order to avoid any spurious data due to background signals, Joule heating etc., a probe equipped with a set of Keithley meters and the Quantum Design MPMS XL magnetometer is specially made for simultaneous measurements of magnetization and electrical resistivity of the sample as a function of electrical current and temperature. All measurements are painstakingly repeated and verified on several single crystals for a few dozen times to ensure consistence.

Figure 16A:
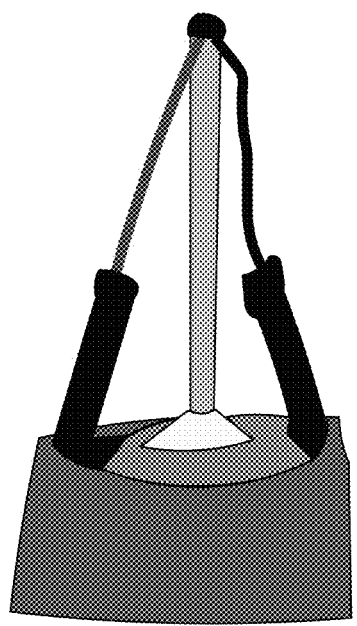
FIGS. 16A and 16B illustrate exemplary neutron diffraction and current-driven lattice changes in $Ca_2Ru_{0.97}Mn_{0.03}O_4$.
Figure 16B:
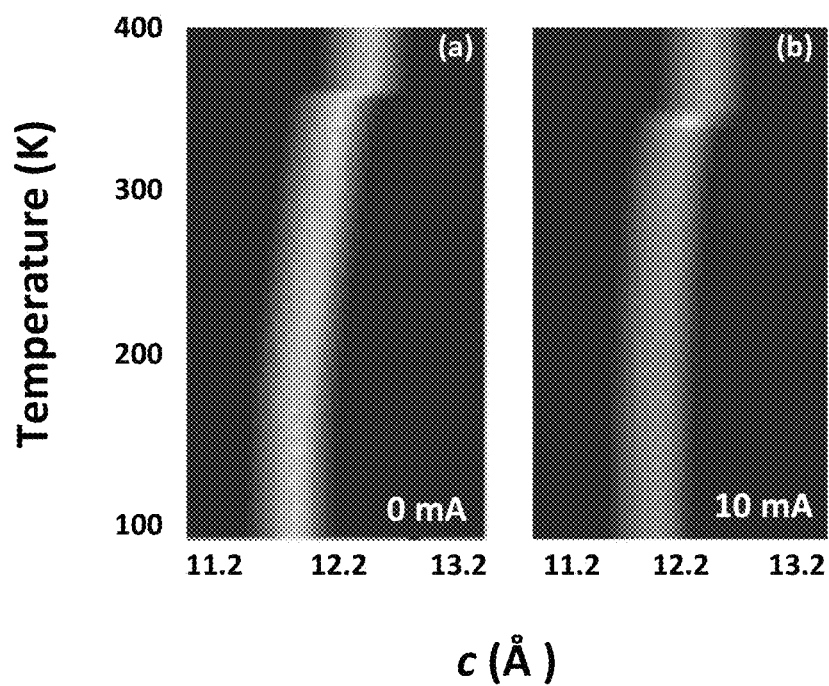

FIGS. 16A and 16B illustrate neutron diffraction and current-driven lattice changes in $Ca_2Ru_{0.97}Mn_{0.03}O_4$. FIG. 16A illustrates the neutron diffraction with applied electrical current: the single crystal $Ca_2Ru_{0.93}Mn_{0.03}O_4$ with the electrical contacts for the neutron diffraction measurements. FIG. 16B illustrates two representative contour plots for the temperature dependence of the lattice parameter c axis at current I=0 and 10 mA (J=2 $A/cm^2$) applied in the basal plane.

The crystal structure of the central compound of one exemplary embodiment of the present technology, $Ca_2Ru_{0.97}Mn_{0.03}O_4$, which retains the low-temperature orthorhombic symmetry (Pbca, No.61), is found extraordinarily susceptible to applied current for the studied temperature range of 80-400 K. The crystal for neutron diffraction with applied current is shown in FIG. 16A. Two representative contour plots (FIG. 16B) for the temperature dependence of the c-axis at current I=0 and 10 mA (J=2 $A/cm^2$) illustrate an abrupt change in the c-axis at $T_{MI}$ but no evidence for inhomogeneity and the phase mixture of high-temperature S-Pbca and low-temperature L-Pbca at all currents.

Figures 17A, 17B, 17C, 17D:
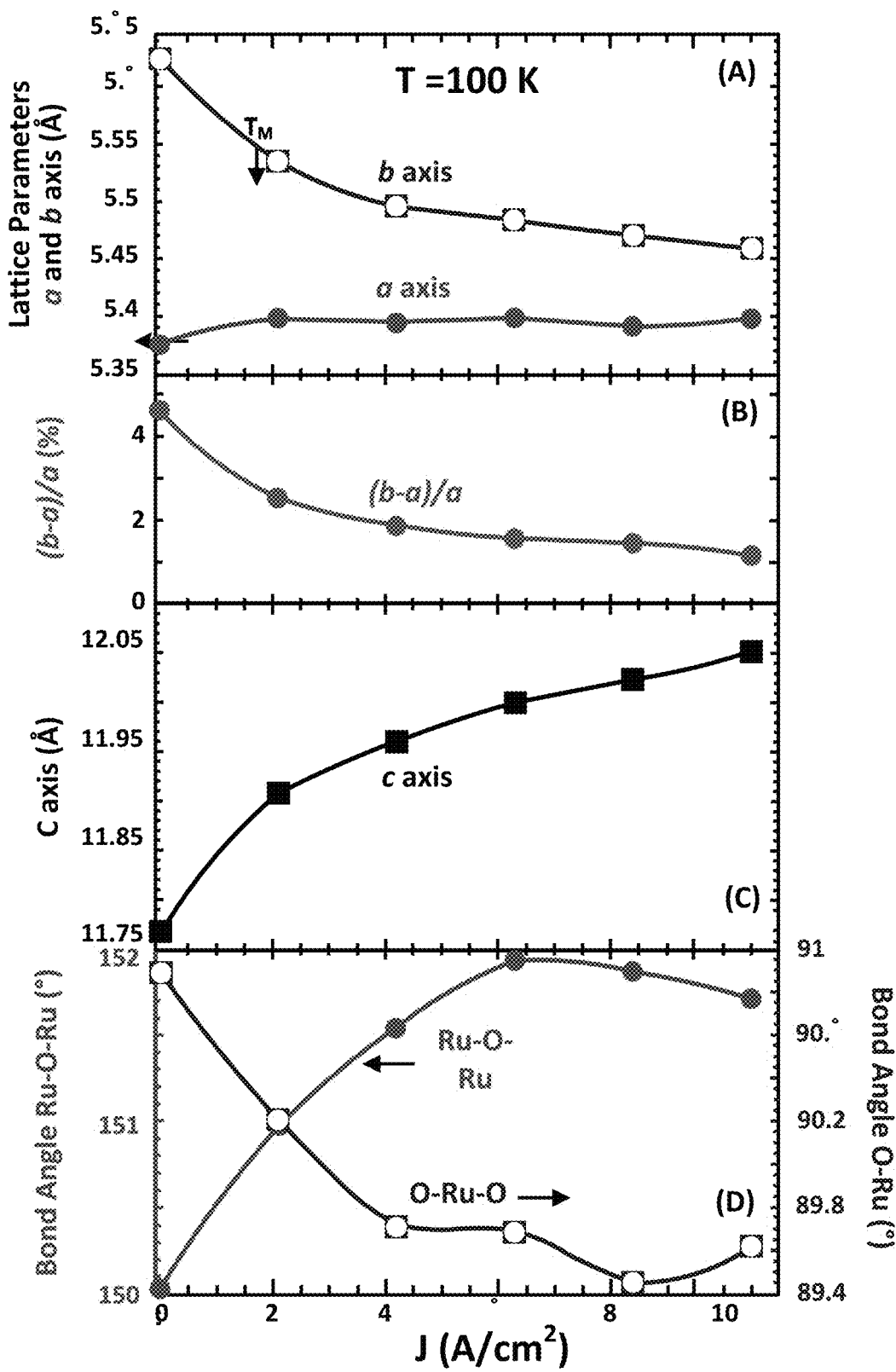
FIGS. 17A-17D further illustrate exemplary neutron diffraction and current-driven lattice changes in $Ca_2Ru_{0.97}Mn_{0.03}O_4$.

FIGS. 17A-17D further illustrate neutron diffraction and current-driven lattice changes in $Ca_2Ru_{0.97}Mn_{0.03}O_4$. FIG. 17A illustrates the current density J dependence at 100 K of the lattice parameters a and b axis. FIG. 17B illustrates the orthorhombicity defined by (b-a)/a. FIG. 17C illustrates the c axis and FIG. 17D illustrates the bond angles Ru—O—Ru (red, left scale) and O—Ru—O (blue, right scale).

Figure 18A:
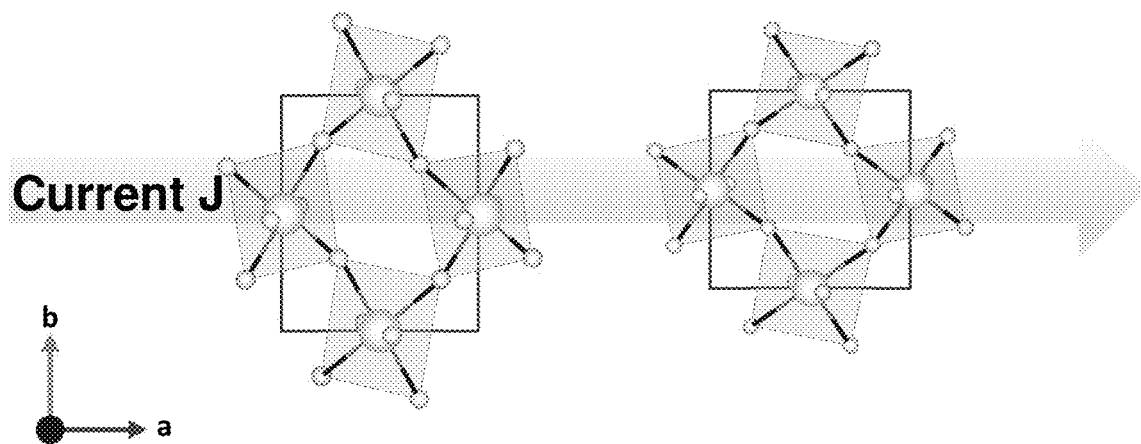
FIGS. 18A-18C further illustrate exemplary neutron diffraction and current-driven lattice changes in $Ca_2Ru_{0.97}Mn_{0.03}O_4$.
Figure 18B:
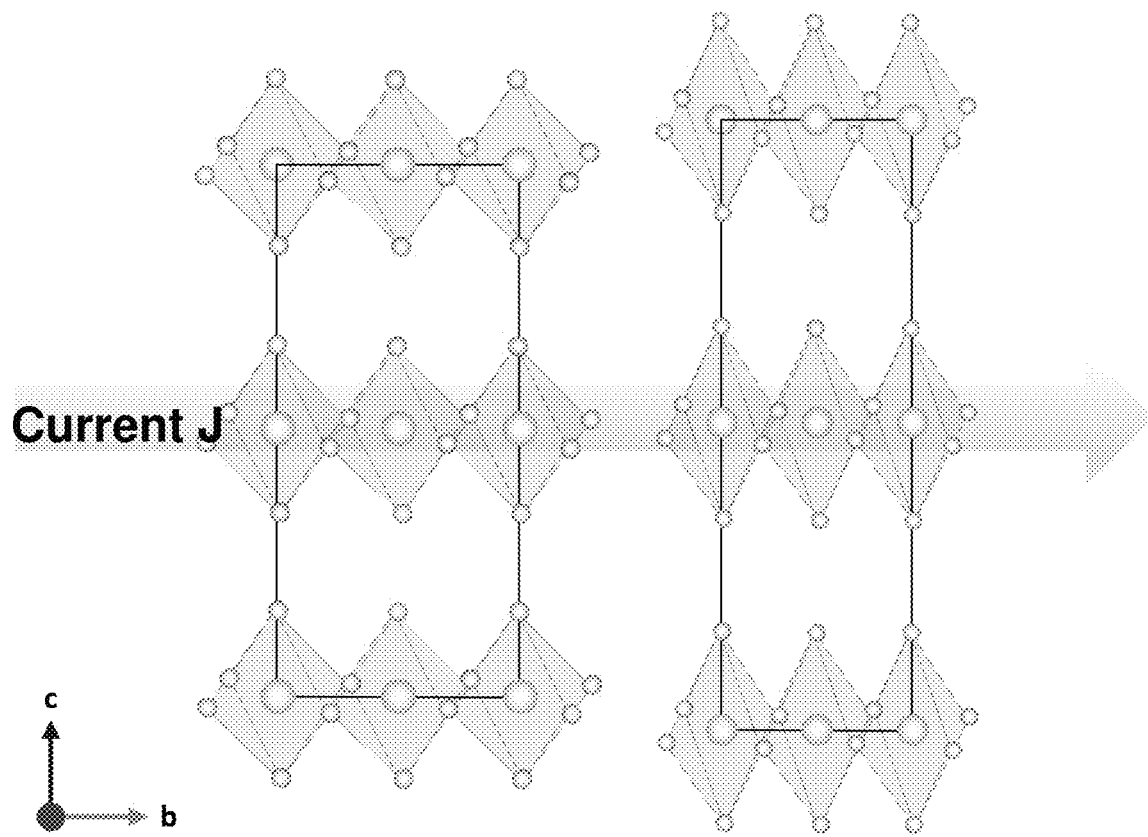
Figure 18C:
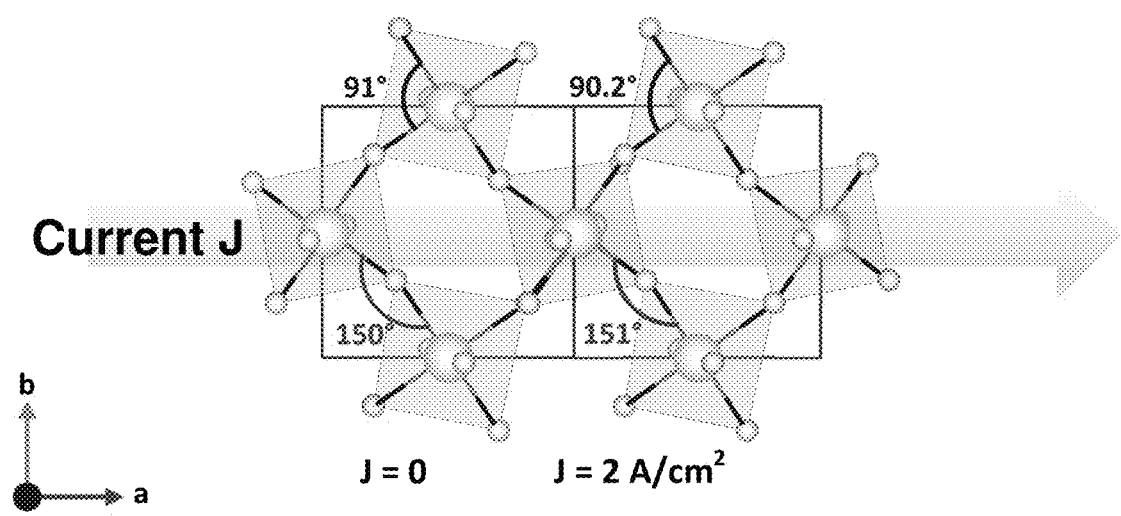

Focus now on the structural data at 100 K culled via neutron diffraction as a function of current density, J, applied within the basal plane. As illustrated in FIG. 17A, one major effect is that the applied current progressively, significantly reduces the orthorhombic distortion; for example, at J=2 A/cm$^2$, the lattice parameter b-axis contracts by 1.6% whereas the a-axis expands by 0.4%. As a result, the orthorhombicity defined by (b−a)/c decreases from 4.6% at J=0 A/cm$^2$ to 2.5% at J=2 A/cm$^2$ and eventually to 1.2% at J=10.5 A/cm$^2$ (FIG. 17B). At the same time, the c axis expands by 1.2% and 2.4% at J=2 A/cm$^2$ and 10.5 A/cm$^2$, respectively (FIG. 17C). This trend of reducing the orthorhombicity and elongating the c-axis under current is remarkably similar to the modest-pressure effect on the lattice below 2 GPa. The weakening orthorhombicity is accompanied by relaxation of bond angles. The bond angle Ru—O—Ru, which defines the rotation of RuO$_6$ octahedra, increases by one degree at J=2 A/cm$^2$ (from 150° to 151°) and two degrees at J=6 A/cm$^2$, resulting in less buckled RuO$_6$ octahedra (FIG. 17D). In addition, the bond angle O—Ru—O decreases from 91° to 90.2° at J=2 A/cm$^2$, close to the ideal 90° (FIG. 17D). Note that both bond angles become less ideal again at J≥6 A/cm$^2$ (which, along with other observations, further rules out effects of Joule heating). In essence, applied current significantly reduces the orthorhombicity, expands the c axis and relaxes the bond angles, as schematically illustrated in FIGS. 18A-18C. These critical lattice changes destabilize the AFM state.

FIGS. 18A-18C further illustrate neutron diffraction and current-driven lattice changes in Ca$_2$Ru$_{0.97}$Mn$_{0.03}$O$_4$. The schematics illustrating the current-induced lattice changes: (FIG. 18A) the reduced orthorhombicity, (FIG. 18B) the elongated unit cell, and (FIG. 18C) the increased bond angles. The displayed values of the bond angles Ru—O—Ru (red) and O—Ru—O (blue) are for J=0 and J=2 A/cm$^2$, respectively.

Figures 19A, 19B:
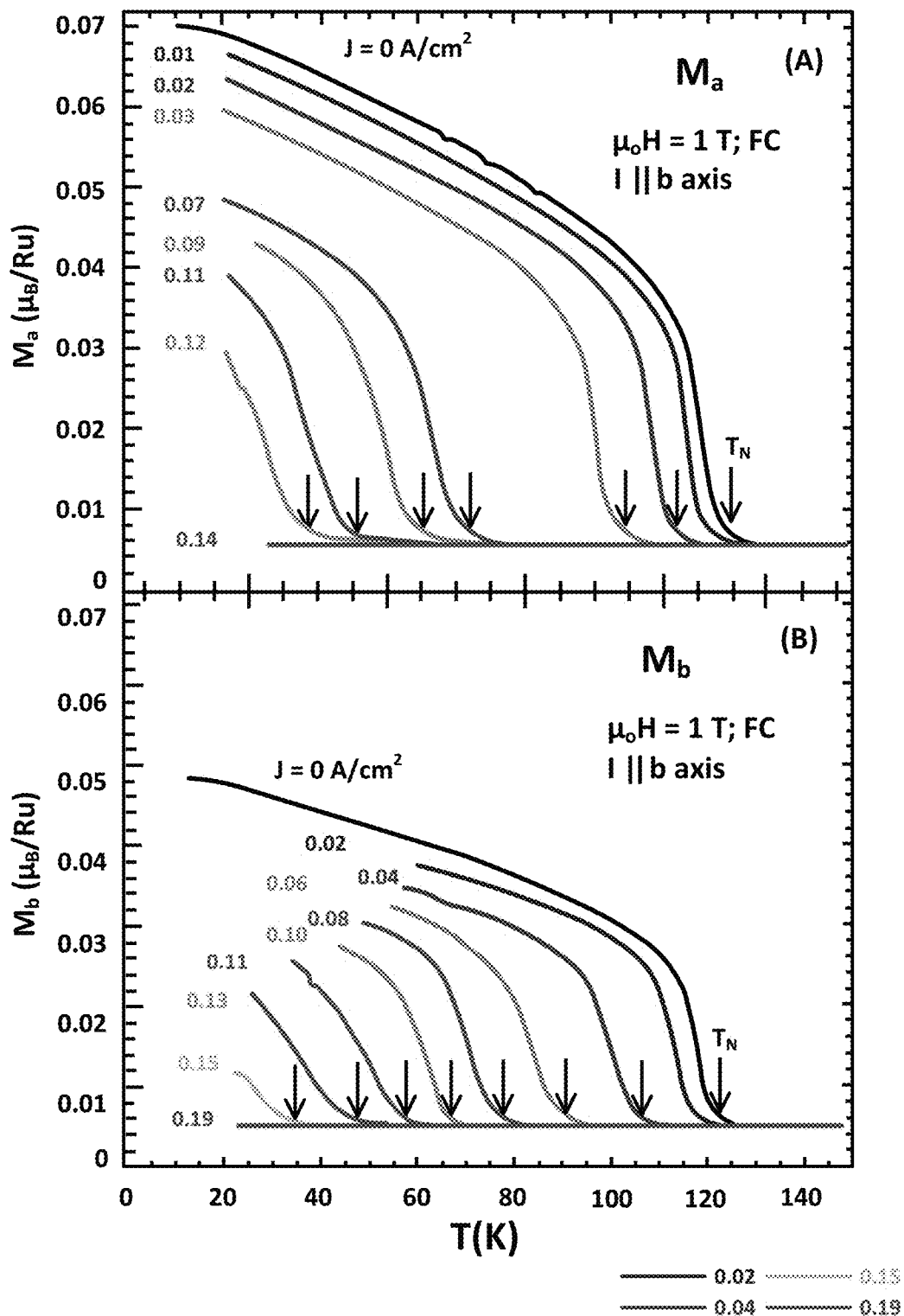
FIGS. 19A-19C illustrate exemplary current-driven magnetic and transport properties of $Ca_2Ru_{0.97}Mn_{0.03}O_4$.
Figure 19C:
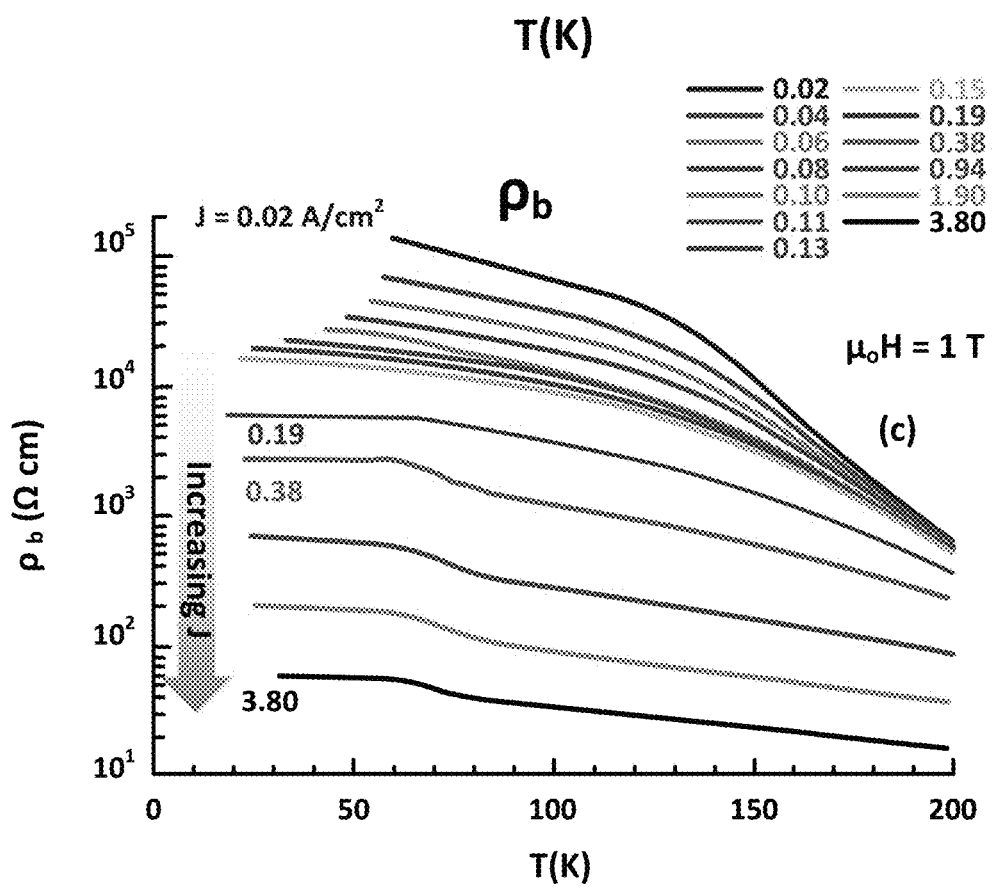

FIGS. 19A-19C illustrate Current-driven magnetic and transport properties of Ca$_2$Ru$_{0.97}$Mn$_{0.03}$O$_4$. The temperature dependence at various current density J applied along the b axis of (FIG. 19A) the a-axis magnetization M$_a$, (FIG. 19B) the b-axis magnetization M$_b$, and (FIG. 19C) the b-axis resistivity $\rho_b$. The magnetic field is at 1 T. Note that M$_a$ and M$_b$ are plotted in the same scale for comparison.

The magnetization along the a- and b-axis, M$_a$ and M$_b$, sensitively responds to applied current along the b-axis. As illustrated in FIGS. 19A and 19B, the Néel temperature T$_N$ decreases systematically and rapidly from 125 K at J=0 A/cm$^2$ to 29 K at J=0.15 A/cm$^2$ in M$_b$ and 40 K at J=0.12 A/cm$^2$ in M$_a$ and eventually vanishes at a critical current density J$_c$~0.15 A/cm$^2$ (the slight difference in J$_c$ for M$_a$ and M$_b$ is insignificant and likely due to estimates of the small cross-sectional area of the sample). The magnetic anisotropy between M$_a$ and M$_b$ with M$_a$>M$_b$ is evident in FIGS. 19A and 19B. Importantly, the diminishing AFM state is accompanied by a drastic decrease in the b-axis resistivity, $\rho_b$, by up to four orders of magnitude (FIG. 19C), consistent with concurrent, progressive changes in orbital populations dictating the transport properties. Note that $\rho_b$ and M$_b$ are simultaneously measured.

Figures 20A, 20B:
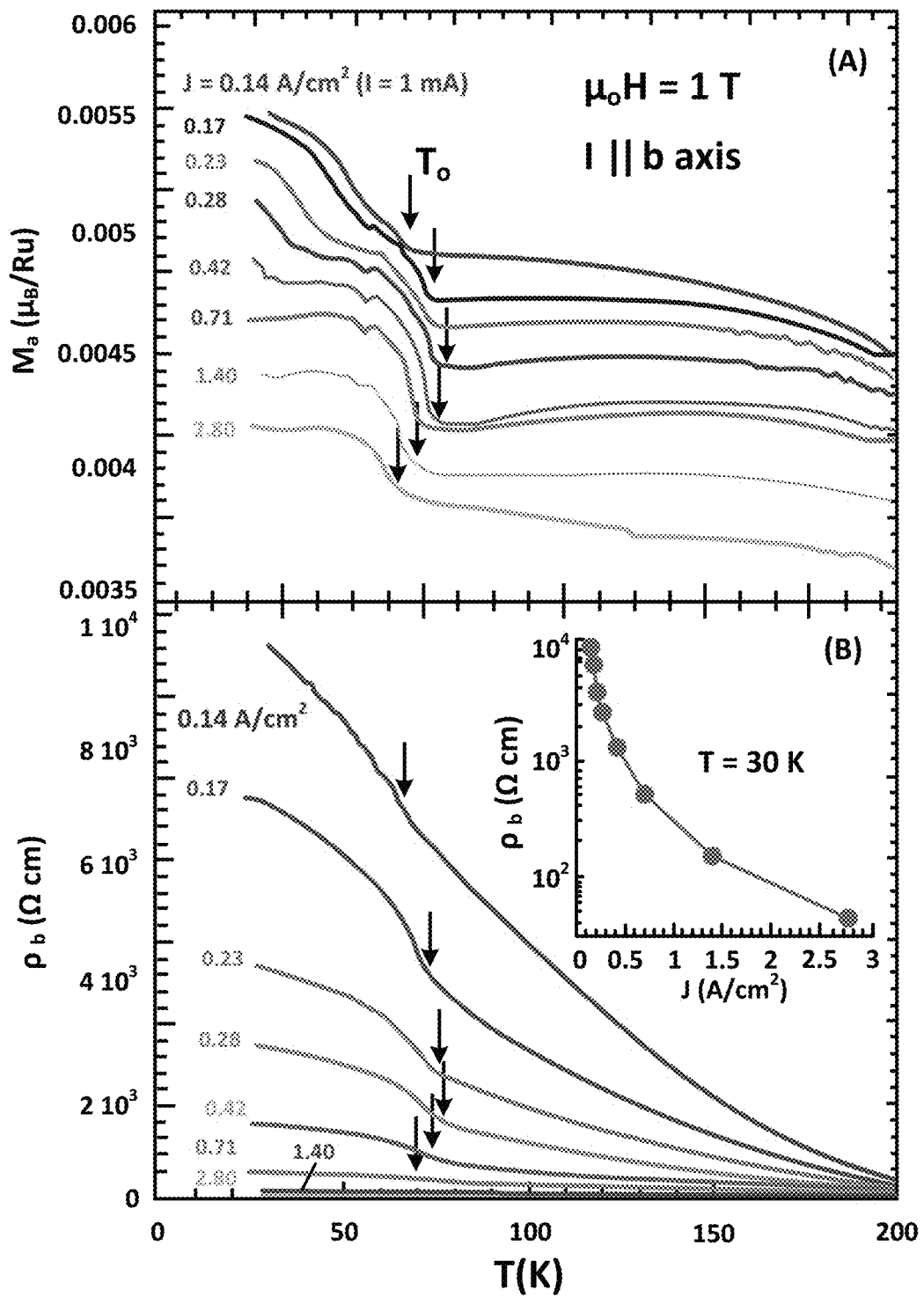
FIGS. 20A-20C illustrate an exemplary current-induced ordered state at $J \geq 0.14$ A/cm².
Figure 20C:
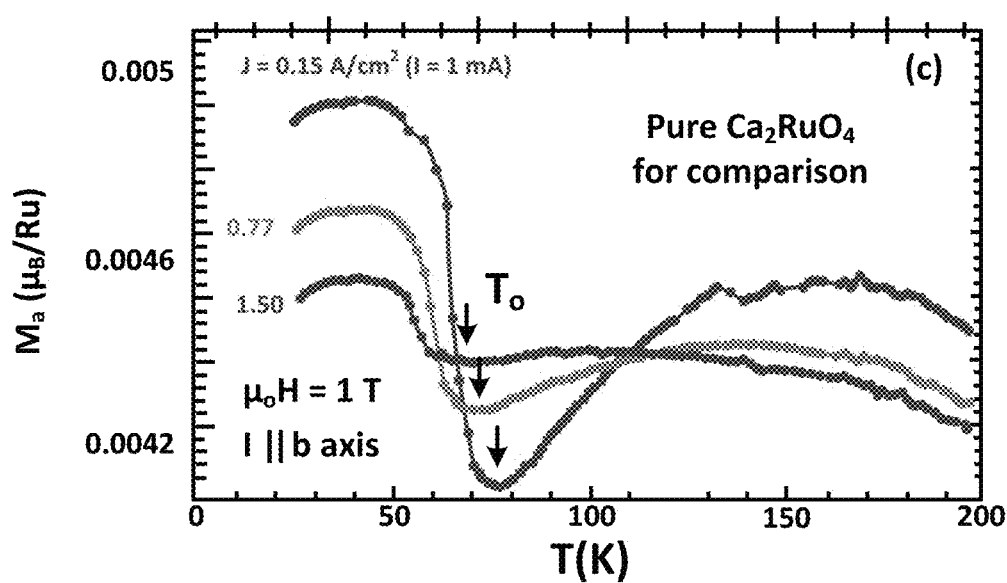

FIGS. 20A-20C illustrate current-induced ordered state at J≥0.14 A/cm$^2$. The temperature dependence at various current density J applied along the b axis of (FIG. 20A) the a-axis magnetization M$_a$ and (FIG. 20B) the b-axis resistivity $\rho_b$ for Ca$_2$RuO$_{0.97}$Mn$_{0.03}$O$_4$; Inset: $\rho_b$ at 30 K as a function of J. The magnetic field is at 1 T. Note that both M$_a$ and $\rho_b$ are simultaneously measured. FIG. 20C illustrates the a-axis magnetization M$_a$ for pure Ca$_2$RuO$_4$ at a few representative J for comparison.

A new, distinct phase emerges as the AFM state vanishes. The following example of the present technology focuses on M$_a$ at higher J as M$_b$ behaves similarly. Immediately following the disappearance of the AFM, a pronounced anomaly marked by T$_O$ precipitates near J$_c$, as shown in FIGS. 20A and 20B. T$_O$ rises initially, peaks near J=0.28 A/cm$^2$ before slowly decreasing with increasing J (FIG. 20A). The simultaneously measured $\rho_b$ closely tracks M$_a$ with a well-defined anomaly corresponding to T$_O$, signaling a strong correlation between electron hopping and this new state (FIG. 20B). The sharp rise in $\rho_b$ at T$_O$ implies a presence of either an AFM or orbital order. However, $\rho_b$ shows a disproportionally large increase at T$_O$, compared to the corresponding enhancement in M$_a$, thus a new orbital order may be more likely. The simultaneous changes in both M and $\rho$ at T$_O$ sharply contrast those of the ambient state in which T$_{MI}$>>T$_N$. Overall, $\rho_b$ reduces by over three orders of magnitude below T$_O$ as J increases from 0.14 A/cm$^2$ to 2.8 A/cm$^2$, e.g., at 30 K (FIG. 20B inset). It is conceivable this new orbital order might be a result of current-driven lattice changes near T$_O$. As pointed out above, the lattice responds similarly to applied current and modest pressure (<2 GPa), it is therefore encouraging that a recent neutron diffraction study of the title material reveals a distinct lattice change near 80 K at 1.8 GPa.

It is conspicuous that current-induced diamagnetism, which is reported to exist in pure Ca$_2$RuO$_4$, is absent in not only Ca$_2$Ru$_{0.97}$Mn$_{0.03}$O$_4$ but also pure Ca$_2$RuO$_4$. For comparison and more clarification, the same measurements are conducted on pure Ca$_2$RuO$_4$ and 9% Mn doped Ca$_2$RuO$_4$. M$_a$ (and $\rho_b$, not shown) for pure Ca$_2$RuO$_4$ (FIG. 20C) and 9% Mn doped Ca$_2$RuO$_4$ exhibits behavior remarkably similar to that seen in FIG. 20A for 3% Mn doped Ca$_2$RuO$_4$. These results undoubtedly indicate the current-induced behavior above and below T$_O$ arises from the underlying properties of Ca$_2$RuO$_4$, independent of Mn doping. This is consistent with the fact that low Mn doping retains the underlying properties of Ca$_2$RuO$_4$. To further rule out any spurious behavior from the experimental setup, a parallel, controlled study on materials with magnetization having the same orders of magnitude, such as antiferromagnetic BaIrO$_3$, was conducted; the results show no discernible current-induced changes in magnetization, confirming the adequacy of the measurements.

With the above confirmation, return now to a central compound of this technology, 3% Mn doped Ca$_2$RuO$_4$. At higher J (>1 A/cm$^2$), the magnetization and the resistivity become peculiarly history-dependent at T>T$_O$. This behavior is observed when the same samples are measured in two different ways, respectively: (1) the samples are measured when J gradually increases from 0 to 2.8 A/cm$^2$; i.e., M and $\rho$ for a smaller J is always measured before M and $\rho$ for a larger J. The samples measured in this sequential fashion are denoted as "Trained". (2) The same samples are then taken out of the measurement system, subsequently reinstalled and measured again; but unlike the trained samples, they are measured at a larger J, e.g., 1.4 A/cm$^2$, at once without any prior measurements at smaller J. The samples measured in such a nonsequential, abrupt manner are denoted as "Untrained". The data presented in FIGS. 20A-20C are obtained from the trained samples. After these samples are untrained, the behavior is remarkably different, and FIGS. 21A and 21B illustrate such a difference.

Figures 21A, 21B:
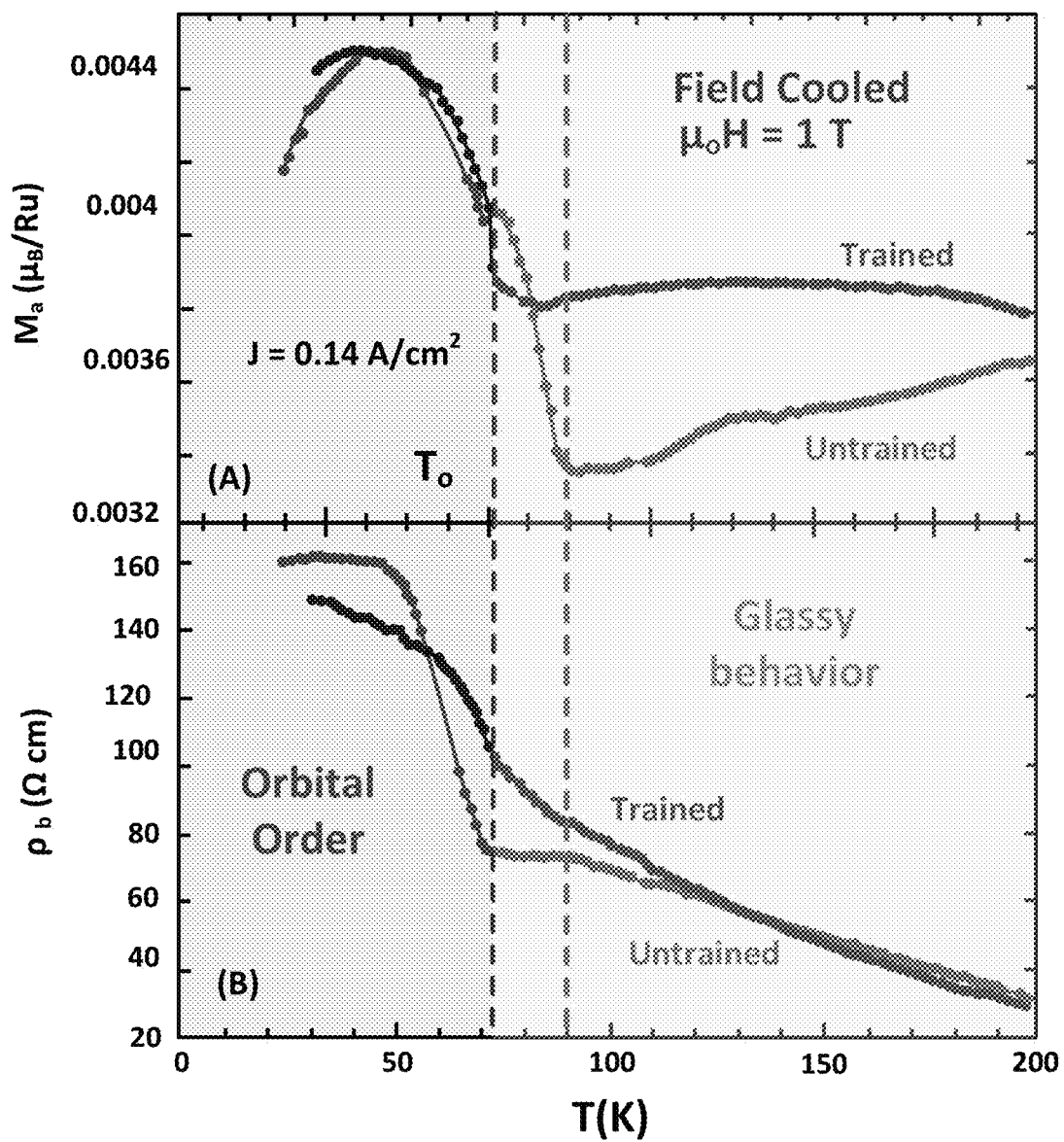
FIGS. 21A and 21B illustrate an exemplary comparison between "trained" and "untrained" samples at $J=1.4$ A/cm² for $Ca_2Ru_{0.97}Mn_{0.03}O_4$.

FIGS. 21A and 21B illustrate a comparison between "trained" and "untrained" samples at J=1.4 A/cm$^2$ for Ca$_2$Ru$_{0.97}$Mn$_{0.03}$O$_4$. The temperature dependence of (FIG. 21A) the a-axis magnetization M$_a$ and (FIG. 21B) the b-axis resistivity $\rho_b$ for the trained (blue) and untrained (red) samples. Note that (1) an abrupt, twofold jump in $\rho_b$ below $T_O$ for the untrained sample, and (2) the trained and untrained samples are the same samples but are measured differently.

$M_a$ at 1.4 A/cm² for the untrained sample shows a much stronger anomaly occurring at 90 K rather than $T_O$ but remains essentially unchanged below $T_O$ (FIG. 21A). $\rho_b$ exhibits little difference above 90 K but behaves differently below 90 K (FIG. 21B). In particular, $\rho_b$ for the untrained sample gives rise to an abrupt, twofold increase below $T_O$. Such a huge jump in $\rho_b$ below $T_O$ (from ~80 Ωcm to ~160 Ωcm), sharply contrasting the weaker change in $M_a$, reaffirms the presence of the new orbital order rather than an AFM order. This orbital order leads to a re-entry into a considerably more insulating state. Nevertheless, this history-dependence is both intriguing and mysterious. It is already established that the current-reduced structural distortions (FIG. 16B) effectively diminish the AFM at J≥0.15 A/cm² (FIGS. 17A-17D), thus favoring a competing FM state. As a result, further increasing J inevitably enhances the competition between the FM and AFM interactions but in a metastable manner, leading a peculiar glassy state above $T_O$. As temperature decreases, a "rigid", orbitally ordered state eventually prevails below $T_O$. This may qualitatively explain the strongly sample-history-dependent $M_a$ at T>$T_O$ and the essentially unchanged $M_a$ below $T_O$ (FIG. 21A). It is emphasized that such a glassy behavior is insignificant at J<1 A/cm², therefore it is unlikely due to Mn doping; the neutron diffraction data in FIG. 16B also rules out any current-induced inhomogeneous effect.

Figure 22A:
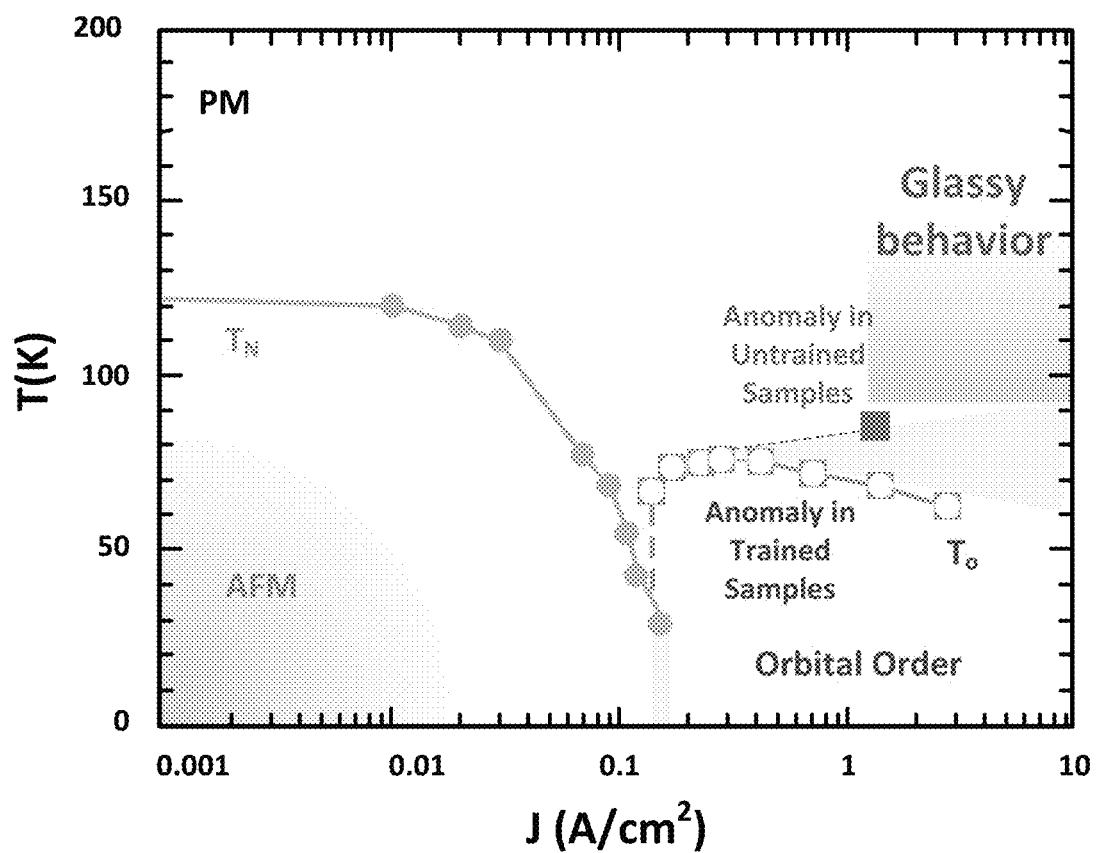
FIG. 22A illustrates an explored T-J phase diagram illustrating a critical regime near 0.15 A/cm² that separates the vanishing antiferromagnetic order and the new orbital order.

FIG. 22A illustrates an explored T-J phase diagram illustrating a critical regime near 0.15 A/cm² that separates the vanishing antiferromagnetic order and the new orbital order. The glassy behavior occurs at J>1 A/cm² and T>$T_O$. The grey square indicates the anomaly seen in the untrained samples; the grey area highlights the difference between the trained and untrained samples.

Figure 22B:
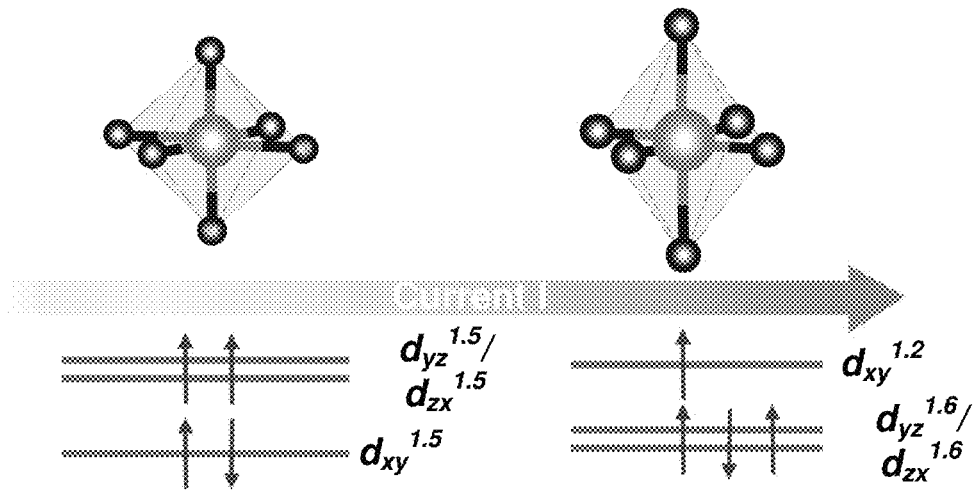
FIG. 22B illustrates at $T>T_O$ the current-driven elongating of octahedra $RuO_6$ and corresponding changes in $t_{2g}$ orbital populations.

FIG. 22B illustrates at T>$T_O$ the current-driven elongating of octahedra RuO$_6$ and corresponding changes in $t_{2g}$ orbital populations. Note that the non-integer numbers of electrons are because a ½-hole is transferred to the oxygen.

It is clear that small current as a new external stimulus effectively suppresses the AFM state and precipitates the new, intriguing phases below and above $T_O$, as illustrated in FIG. 22A. Fundamentally, this is because of the current-driven lattice relaxation. A combination of rotation, tilting and flattening of RuO$_6$ is responsible for the AFM state. Applied electrical current engaging with the $t_{2g}$ orbitals, discussed below, effectively weakens all these crucial structural distortions that enable the AFM state, thus diminishing the AFM (FIGS. 16 and 17).

The overall response of the crystal structure, resistivity and magnetism to applied in-plane electrical current can be understood theoretically in a tight-binding picture as follows. A tight-binding picture based on local orbitals is appropriate here since the metallic state is a current-driven instability of an insulating state that is captured by local orbital occupancies. The experimental feature to explain (see FIG. 16) is that applied in-plane current suppresses the transition to the insulator and the octahedral tilts and rotations while reducing a-b axis asymmetry.

Without applied current, Ru$^{4+}$ ions nominally have 2 holes in the $t_{2g}$ orbitals but x-ray spectroscopy studies suggest that a ½-hole is transferred to the oxygen. At high temperatures, in the metallic state, the remaining 3/2 hole is equally split in a 1:1 ratio between the $d_{xy}$ orbital and the manifold of $d_{xz}/d_{yz}$ orbitals (giving an electron occupancy roughly ~$d_{xy}^{1.2}d_{xz}^{1.6}d_{yz}^{1.6}$). At T<$T_{MI}$, the first-order structural transition at $T_{MI}$=357 K leads to the lattice distortions and the rotation, tilting and flattening of RuO$_6$, which transfers more holes from $d_{xy}$ to $d_{xz}/d_{yz}$, leading to a 1:2 ratio of hole occupancies in $d_{xy}$ vs $d_{xz}/d_{yz}$ (giving an electron occupancy roughly ~$d_{xy}^{1.5}d_{xz}^{1.5}d_{yz}^{1.5}$). The insulating state below $T_{MI}$ thus has each orbital at exactly ¾ electron filling (or ¼-hole filling). In contrast, the metallic state above $T_{MI}$ has unequal filling, with a nearly filled $d_{xz}/d_{yz}$ manifold (fewer holes) and, importantly, a nearly half-filled $d_{xy}$ orbital (more holes). This analysis suggests that the conductivity in the metallic phase above $T_{MI}$ is primarily enhanced by the d, orbitals.

Now consider the nonequilibrium electron occupancies stabilized with an applied electric current. Within the $d_{xy}$ band, the electrons have large hopping amplitude from each Ru ion to each 4 of its neighbors, via the $p_x$ and $p_y$ orbitals on the four surrounding oxygens. This is not true for the $d_{xz}$ or $d_{yz}$ hands. So half-filling the $d_{xy}$ hand is far more favorable for the conductivity than half filling either the $d_{xz}$ or $d_{yz}$ bands or uniformly quarter-filling the entire multi-band manifold.

Driving an in-plane current forces a metallic state to persist which, based on this theoretical picture, should lead to two effects: (1) the applied current minimizes crystalline distortions in the basal plane, so as to maximize interorbital hopping for in-plane conductivity; and (2) applying a current keeps the $d_{xy}$ band as close to half filling as possible, hence also avoiding the crystal distortions that are known (from the metal-insulator transition at zero applied current) to force $d_{xy}$ away from half filling. These two effects (FIG. 22B) exactly capture the experimentally observed behavior of the resistivity and crystal structure with applied current.

Clearly, at the heart of the current-driven phenomena are the critical lattice modifications via current-driven nonequilibrium electron populations of the $t_{2g}$ orbitals, particularly the $d_{xy}$ orbital.

The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A composition of matter consisting primarily of a stabilizing element and a transition metal oxide, wherein the transition metal oxide is an anti-ferromagnetic Mott insulator with strong spin orbit interactions, and the composition of matter has a canted crystal structure.

2. The composition of matter of claim 1, wherein the transition metal oxide is a 4d or 5d transition metal oxide.

3. The composition of matter of claim 1, wherein the transition metal oxide is Iridium Oxide or Ruthenium Oxide.

4. The composition of matter of claim 1, wherein the anti-ferromagnetic Mott insulator has spin orbit interactions between 0.15 eV and 0.5 eV.

5. The composition of matter of claim 1, wherein the stabilizing element is selected from the group of Strontium, Barium, and Calcium.

6. The composition of matter of claim 1, wherein the composition of matter is a single crystal grown using a self-flux method.

7. The composition of matter of claim 1, wherein the composition of matter is selected from the group comprising: $Sr_2IrO_4$, $Sr_2Ir_{0.97}Tb_{0.03}O_4$, $Sr_3Ir_2O_7$, $BaIrO_3$, $Ca_3Ru_2O_7$, and doped $Ca_2RuO_4$.

8. A method for electrical-current control of structural and physical properties of a material, the method comprising:
applying current along a first dimension of the material, wherein the material consists of a stabilizing element and a transition metal oxide, wherein the transition metal oxide is an anti-ferromagnetic Mott insulator with strong spin orbit interactions, and the composition of matter has a canted crystal structure; and
wherein applying current along a first dimension of the material results in a change in size and resistivity of the material along a second dimension.

9. The method of claim 8, wherein the applied current is between 50 mA and 150 mA.

10. The method of claim 8, wherein the material is maintained at a temperature between 50 K and 300 K.

11. The method of claim 8, where in applying current along a first dimension of the material results in the material having a negative differential resistance.

12. The method of claim 8, wherein the applied current is ramped from 0 mA to a desired current.

13. The method of claim 8, wherein the applied current is abruptly applied to the material.

14. The method of claim 8, wherein the transition metal oxide is a 4d or 5d transition metal oxide.

15. The method of claim 8, wherein the transition metal oxide is Iridium Oxide or Ruthenium Oxide.

16. The method of claim 8, wherein anti-ferromagnetic Mott insulator has spin orbit interactions between 0.15 eV and 0.5 eV.

* * * * *